(12) United States Patent
Nishibayashi et al.

(10) Patent No.: US 11,629,104 B2
(45) Date of Patent: Apr. 18, 2023

(54) BODY OBTAINED BY PROCESSING SOLID CARBON-CONTAINING MATERIAL AND PRODUCING METHOD THEREOF

(71) Applicant: Sumitomo Electric Industries, Ltd., Osaka (JP)

(72) Inventors: Yoshiki Nishibayashi, Osaka (JP); Natsuo Tatsumi, Osaka (JP); Kensei Hamaki, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 150 days.

(21) Appl. No.: 16/638,906

(22) PCT Filed: Aug. 13, 2018

(86) PCT No.: PCT/JP2018/030178
§ 371 (c)(1),
(2) Date: Feb. 13, 2020

(87) PCT Pub. No.: WO2019/035437
PCT Pub. Date: Feb. 21, 2019

(65) Prior Publication Data
US 2020/0361829 A1 Nov. 19, 2020

(30) Foreign Application Priority Data
Aug. 15, 2017 (JP) .............................. JP2017-156850

(51) Int. Cl.
*C30B 33/02* (2006.01)
*C04B 41/91* (2006.01)
(Continued)

(52) U.S. Cl.
CPC .............. *C04B 41/91* (2013.01); *C04B 41/88* (2013.01); *C30B 33/02* (2013.01); *C30B 33/12* (2013.01)

(58) Field of Classification Search
CPC ......... C30B 29/04; C30B 33/02; C30B 33/12; C04B 41/88; C04B 41/91
See application file for complete search history.

(56) References Cited

U.S. PATENT DOCUMENTS

| 4,339,304 A | 7/1982 | Grigoriev et al. |
| 5,135,807 A * | 8/1992 | Ito ...................... C23C 16/0245 428/334 |
| 2001/0047980 A1 * | 12/2001 | McNallan ............... C04B 41/91 216/75 |

(Continued)

FOREIGN PATENT DOCUMENTS

| EP | 0615004 A1 | 3/1994 |
| GB | 2 061 904 B | 3/1983 |

(Continued)

OTHER PUBLICATIONS

Nakano, Takayuki et al., "Ultra-precision Machining of PCD by UV-assisted Polishing," Journal of the Japan Society for Abrasive Technology, vol. 53, No. 4, Apr. 2009, pp. 242-247, including partial English translation.

(Continued)

*Primary Examiner* — Robert M Kunemund
(74) *Attorney, Agent, or Firm* — Faegre Drinker Biddle & Reath LLP

(57) ABSTRACT

This method for producing a body obtained by processing a solid carbon-containing material includes: a step of preparing the solid carbon-containing material having at least a surface composed of solid carbon; and a step of processing the solid carbon-containing material. The step of processing the solid carbon-containing material includes: a sub-step of forming non-diamond carbon by heat-treating the solid carbon in the surface of the solid carbon-containing material; and a sub-step of removing at least a part of the non-diamond carbon.

12 Claims, 22 Drawing Sheets

(51) Int. Cl.
*C04B 41/88* (2006.01)
*C30B 33/12* (2006.01)

(56) References Cited

U.S. PATENT DOCUMENTS

| | | | |
|---|---|---|---|
| 2010/0213175 A1 | 8/2010 | Peng et al. | |
| 2012/0082614 A1 | 4/2012 | Lee et al. | |
| 2014/0268804 A1* | 9/2014 | Yang | F21V 3/049 |
| | | | 362/295 |
| 2016/0115624 A1 | 4/2016 | Pels et al. | |
| 2017/0066110 A1* | 3/2017 | Bird | B24D 18/0009 |
| 2017/0183794 A1* | 6/2017 | Godfried | C30B 25/205 |
| 2017/0320144 A1* | 11/2017 | Nishibayashi | C23C 14/48 |
| 2021/0148005 A1* | 5/2021 | Noguchi | C23C 16/279 |

FOREIGN PATENT DOCUMENTS

| | | |
|---|---|---|
| JP | S56-500371 A | 3/1981 |
| JP | S62-41800 A | 2/1987 |
| JP | H04-331800 A | 11/1992 |
| JP | H08-57753 A | 3/1996 |
| JP | H11-236292 A | 8/1999 |
| JP | 2001-220251 A | 8/2001 |
| JP | 2006-335591 A | 12/2006 |
| JP | 2010-64909 A | 3/2010 |
| JP | 2016-98129 A | 5/2016 |
| RU | 2620392 C1 | 5/2017 |

OTHER PUBLICATIONS

Kitano, Katsuhisa et al., "Low-Frequency Atmospheric Pressure Micro Plasma Jet," Applied Physics, vol. 77, No. 4, Apr. 2008, pp. 383-389, including partial English translation.

Nishibayashi, Yoshiki et al., "Various Field Emitters of Single Crystal Diamond," New Diamond and Frontier Carbon Technology, vol. 13, No. 1, Jan. 2003, pp. 19-30.

Notice of Allowance dated Aug. 10, 2022 that issued in U.S. Appl. No. 16/638,925.

\* cited by examiner

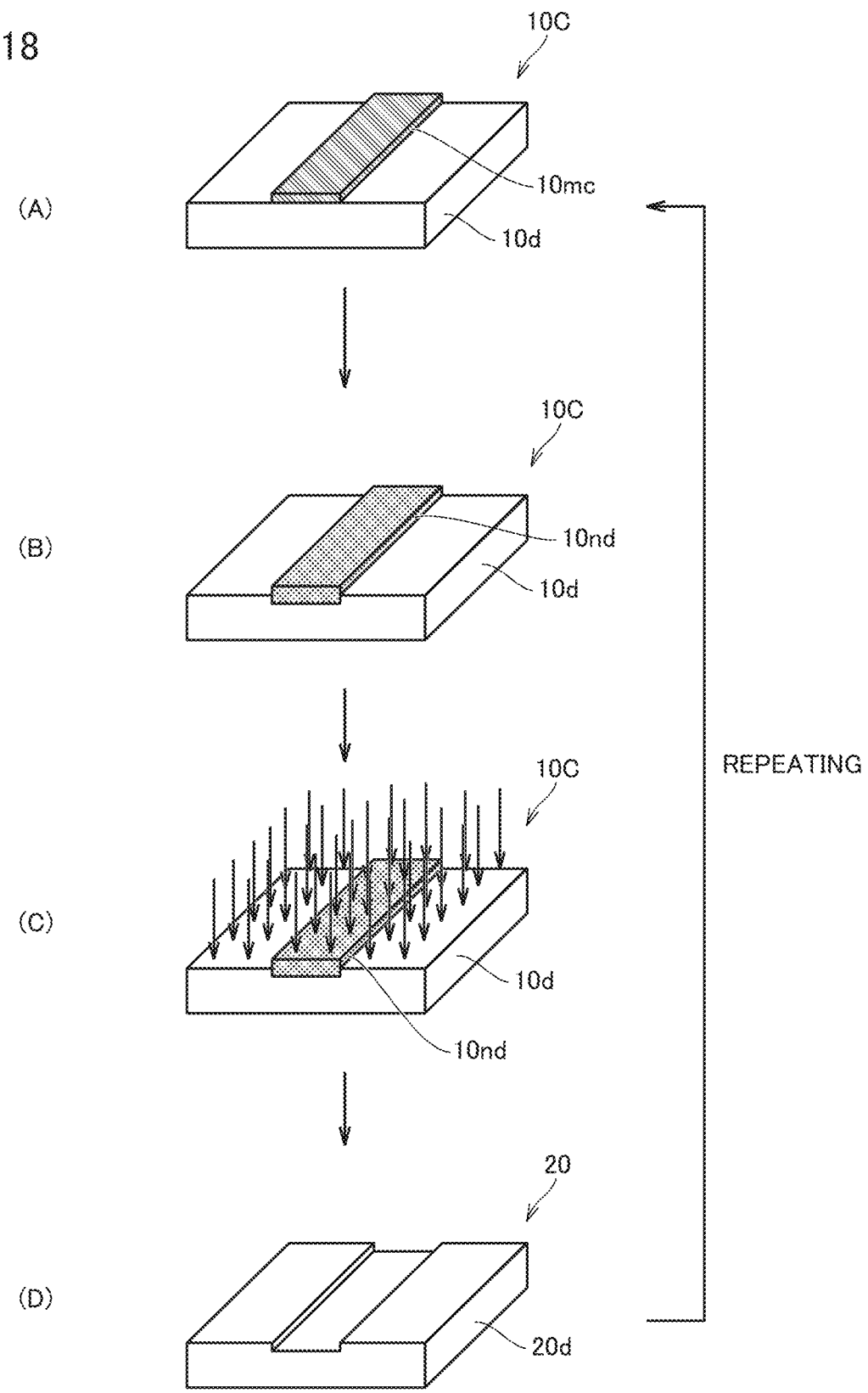

BODY OBTAINED BY PROCESSING SOLID CARBON-CONTAINING MATERIAL AND PRODUCING METHOD THEREOF

TECHNICAL FIELD

The present disclosure relates to a body obtained by processing a solid carbon-containing material and a producing method thereof. The present application claims priority based on Japanese Patent Application No. 2017-156850 filed Aug. 15, 2017. All descriptions described in the Japanese patent application are incorporated herein by reference.

BACKGROUND ART

Examples of methods for processing a solid carbon-containing material such as diamond include mechanical processing methods such as cutting, grinding, and/or polishing, chemical processing methods using excited species such as a plasma, an ion, and/or a radical, and thermochemical processing methods in which solid carbon is solid-solved in or reacted with a metal solid or a metal film.

As the mechanical processing method, Journal of the Japan Society for Abrasive Technology, Vol. 53, No. 4, April 2009, pp. 242-247 (NPL 1) discloses ultra-precision processing of a PCD (diamond sintered body) using UV-assisted polishing. As the chemical processing method, Applied Physics, Vol. 77, No. 4, April 2008, pp. 383-389 (NPL 2) discloses processing of a solid material using a low-frequency atmospheric pressure microplasma jet. New Diamond and Frontier Carbon Technology, Vol. 13, No. 1, 2003 January, pp. 19-30 (NPL 3) discloses processing of single crystal diamond using RIE (reactive ion etching). As the thermochemical processing method, National Patent Publication No. 56-500371 (PTL 1) discloses processing provided by bringing diamond into contact with a mold formed of a metal or an alloy. Japanese Patent Laying-Open No. 2006-335591 (PTL 2) discloses processing in which a single crystal metal thin film is formed on a treated surface of a carbon material, followed by performing a heat treatment to cause carbon in the carbon material to react with the single crystal metal thin film, thereby diffusing the carbon as a metal carbide in the single crystal metal thin film.

CITATION LIST

Patent Literature

PTL 1: National Patent Publication No. 56-500371
PTL 2: Japanese Patent Laying-Open No. 2006-335591

Non Patent Literature

NPL 1: Journal of the Japan Society for Abrasive Technology, Vol. 53, No. 4, April 2009, pp. 242-247
NPL 2: Applied Physics, Vol. 77, No. 4, April 2008, pp. 383-389
NPL 3: New Diamond and Frontier Carbon Technology, Vol. 13, No. 1, 2003 January, pp. 19-30

SUMMARY OF INVENTION

A method for producing a body obtained by processing a solid carbon-containing material according to one aspect of the present disclosure includes: a step of preparing the solid carbon-containing material having at least a surface composed of solid carbon; and a step of processing the solid carbon-containing material, wherein the step of processing the solid carbon-containing material includes: a sub-step of forming non-diamond carbon by heat-treating the solid carbon in the surface of the solid carbon-containing material; and a sub-step of removing at least a part of the non-diamond carbon.

A body obtained by processing a solid carbon-containing material according to one aspect of the present disclosure includes a processed surface, at least a part of the processed surface being composed of solid carbon, wherein: the processed surface of the body obtained by processing a solid carbon-containing material has a smooth shape having a maximum height of less than or equal to 20 μm of small irregularities formed in the processed surface, or a shape having irregularities formed by a smooth surface in the processed surface and having a minimum height of greater than or equal to 30 μm; and the processed surface has a size of greater than or equal to 1 mm square, and a density of polishing damage points in the processed surface is less than or equal to 10 points/mm$^2$.

BRIEF DESCRIPTION OF DRAWINGS

FIG. 18 is a schematic three-dimensional view showing an example of a method for producing a body obtained by processing a solid carbon-containing material according to one aspect of the present disclosure.

DETAILED DESCRIPTION

Figure 1:
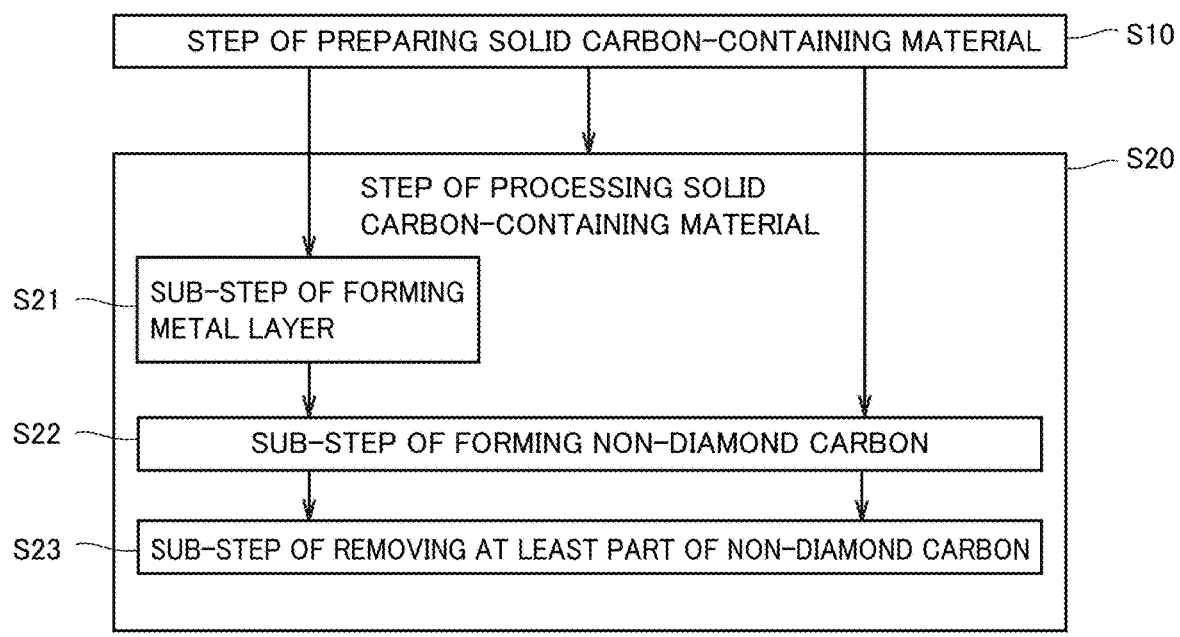
FIG. 1 is a flowchart showing an example of a method for producing a body obtained by processing a solid carbon-containing material according to one aspect of the present disclosure.
Figure 2:
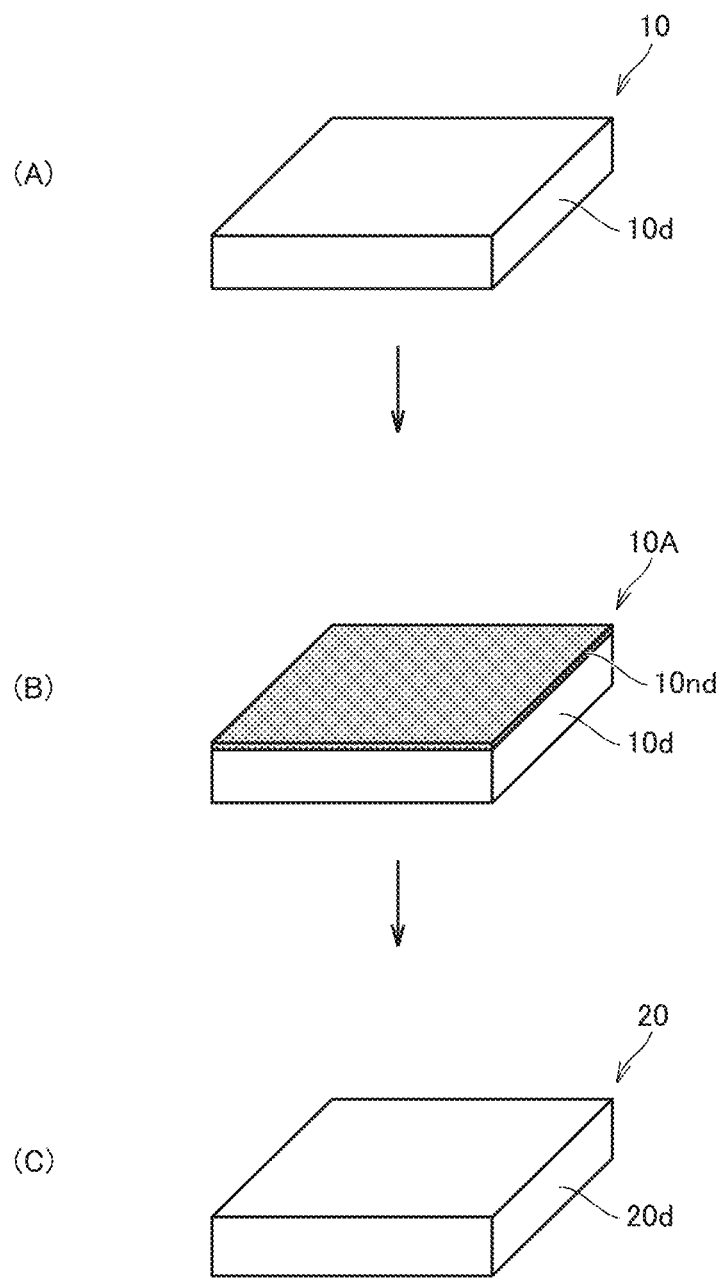
FIG. 2 is a schematic three-dimensional view showing an example of a method for producing a body obtained by processing a solid carbon-containing material according to one aspect of the present disclosure.
Figure 3:
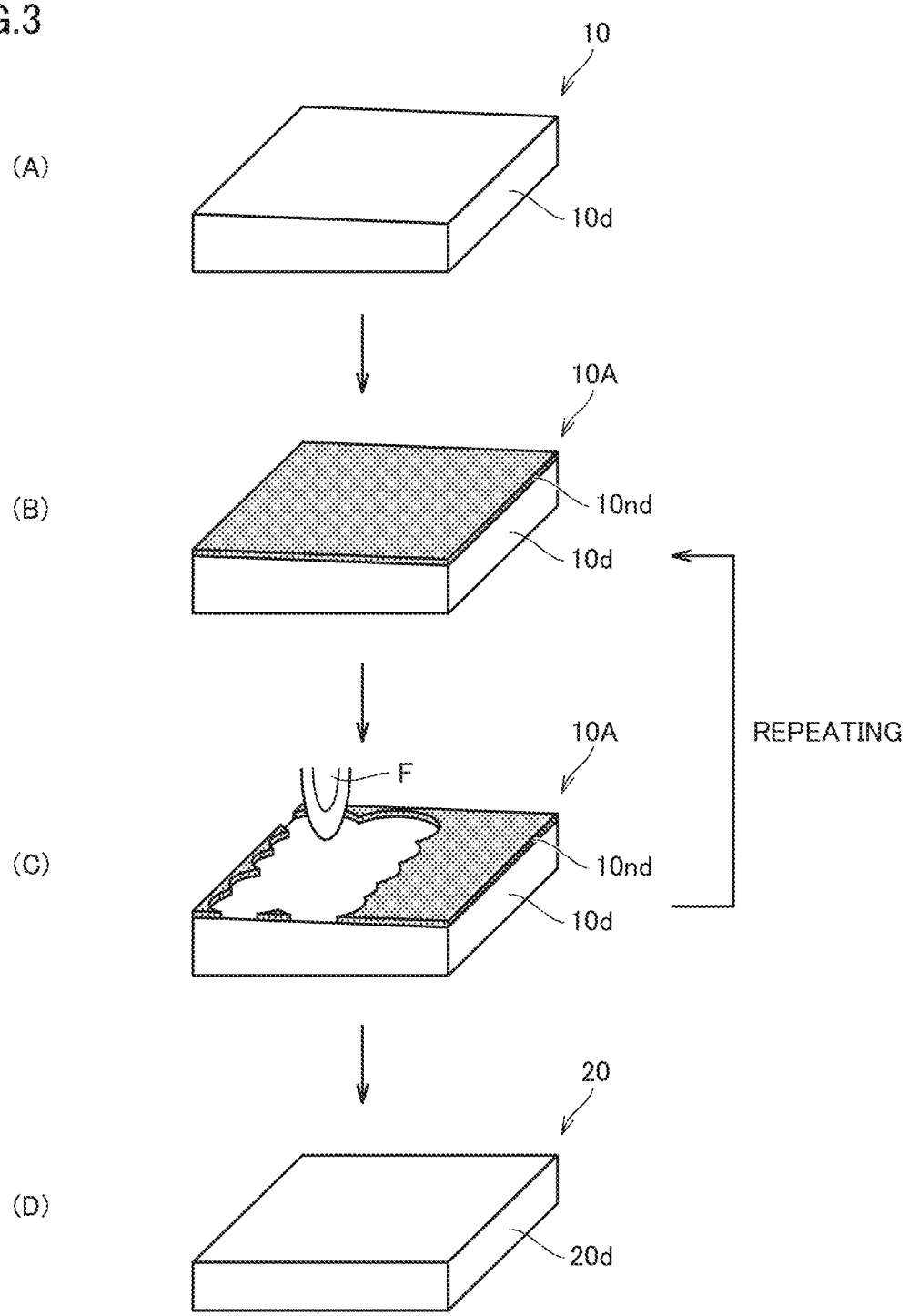
FIG. 3 is a schematic three-dimensional view showing an example of a method for producing a body obtained by processing a solid carbon-containing material according to one aspect of the present disclosure.
Figure 4:
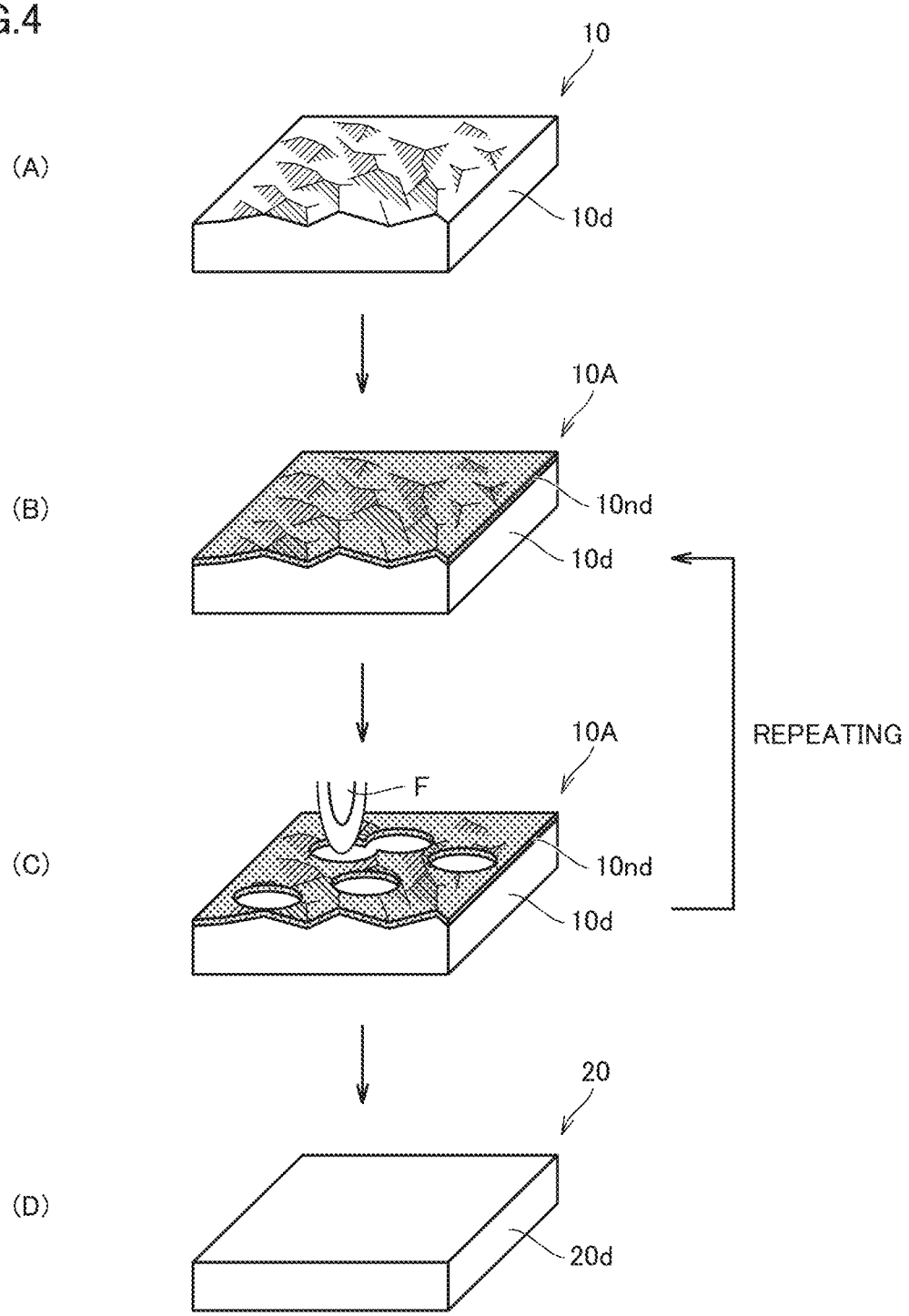
FIG. 4 is a schematic three-dimensional view showing an example of a method for producing a body obtained by processing a solid carbon-containing material according to one aspect of the present disclosure.

Problem to be Solved by the Present Disclosure

The mechanical processing method disclosed in Journal of the Japan Society for Abrasive Technology, Vol. 53, No. 4, April 2009, pp. 242-247 (NPL 1) can provide a smooth processed surface to allow precise processing, but the hardness of a solid carbon-containing material such as diamond varies depending on a plane orientation thereof. Disadvantageously, it takes a long time to process a solid carbon-containing material in a high hardness plane orientation (meaning that it takes greater than or equal to 1 hour to grind a thickness of 1 μm).

Chemical processing methods disclosed in Applied Physics, Vol. 77, No. 4, April 2008, pp. 383-389 (NPL 2) and New Diamond and Frontier Carbon Technology, Vol. 13, No. 1, 2003 January, pp. 19-30 (NPL 3) allow comparatively short processing of about 2 hours to grind a thickness of 10 μm regardless of the high or low hardness depending on the plane orientation of a solid carbon-containing material such as diamond. However, disadvantageously, steep steps and/or fine protrusions remain in the processed surface, which cannot provide smooth processing.

The thermochemical processing method disclosed in National Patent Publication No. 56-500371 (PTL 1) has a problem that it cannot provide precise processing. Examples of the reason for this include (1) a metal or alloy forming a mold is generally a polycrystal, which causes a partially different etching rate, (2) a mold unevenly expands in a high temperature treatment, and (3) the mold is softened at temperatures lower than or equal to a melting point in a high temperature treatment, which causes largely deteriorated accuracy of a mold.

The thermochemical processing method disclosed in Japanese Patent Laying-Open No. 2006-335591 (PTL 2) has problems such as (1) a metal edge portion moves, which causes a deformed pattern shape, (2) the deformation causes anisotropic etching of diamond, (3) a metal edge part diffuses toward diamond having no pattern, and becomes wider than a pattern width, which cannot be controlled, and (4) planar etching (with or without etching) is possible, but three-dimensional curved surface processing (adjustment of an etching amount) is difficult.

Accordingly, it is an object of the present invention to solve the above-described problems, to provide a method for producing a body obtained by processing a solid carbon-containing material which can smoothly process the surface of the solid carbon-containing material in a short time regardless of a plane orientation thereof, and a body obtained by processing a solid carbon-containing material, produced thereby, and having a smooth surface.

Advantageous Effects of Present Disclosure

According to the above, there can be provided a method for producing a body obtained by processing a solid carbon-containing material which can smoothly process the surface of the solid carbon-containing material in a short time regardless of a plane orientation thereof, and a body obtained by processing a solid carbon-containing material, produced thereby, and having a smooth surface.

DESCRIPTION OF EMBODIMENTS

First, embodiments of the present disclosure will be listed and described.

[1] A method for producing a body obtained by processing a solid carbon-containing material according to an embodiment of the present disclosure includes: a step of preparing the solid carbon-containing material having at least a surface composed of solid carbon; and a step of processing the solid carbon-containing material. The step of processing the solid carbon-containing material includes: a sub-step of forming non-diamond carbon by heat-treating the solid carbon in the surface of the solid carbon-containing material; and a sub-step of removing at least a part of the non-diamond carbon. The method for producing a body obtained by processing a solid carbon-containing material of the present embodiment can smoothly process the surface of the solid carbon-containing material (in, for example, a smooth shape or a shape having desired irregularities in a smooth surface) in a short time (in an embodiment of the present disclosure, meaning a short time of less than or equal to 3 hours to grind a thickness of 100 µm, the same applies hereinafter) regardless of a plane orientation thereof. A simple height etching processing time is preferably greater than or equal to 34 µm/h, more preferably greater than or equal to 50 µm/h, still more preferably greater than or equal to 80 µm/h, and particularly preferably greater than or equal to 100 µm/h. If the simple height etching processing time is shorter, a total processing time for scanning to flatten can be shortened. Here, a simple height etching processing speed is an etching processing thickness (reduced thickness) per unit time when the same portion is continuously processed without scanning a plasma, an ion flow current, or a beam.

[2] In the method, an oxygen partial pressure in an atmosphere for heat-treating the solid carbon may be less than or equal to 0.133 Pa. Such a method can more smoothly process the surface of the solid carbon-containing material (in, for example, a smooth shape or a shape having desired irregularities in a smooth surface) with high accuracy in a short time regardless of a plane orientation thereof.

[3] In the method, the step of processing the solid carbon-containing material may further include a sub-step of forming a metal layer on at least a part of the surface before the sub-step of forming non-diamond carbon. Such a method can more smoothly process the surface of the solid carbon-containing material (in, for example, a smooth shape or a shape having desired irregularities in a smooth surface) in a shorter time regardless of a plane orientation thereof.

[4] In the method, the metal layer may contain at least one metal element selected from the group consisting of iron, cobalt, nickel, rhodium, palladium, platinum, iridium, and manganese. Such a method can more smoothly process the surface of the solid carbon-containing material (in, for example, a smooth shape or a shape having desired irregularities in a smooth surface) in a shorter time regardless of a plane orientation thereof.

[5] In the method, the metal layer may contain at least one metal element selected from the group consisting of titanium, zirconium, hafnium, vanadium, niobium, tantalum, chromium, molybdenum, and tungsten. Such a method can more smoothly process the surface of the solid carbon-containing material (in, for example, a smooth shape or a shape having desired irregularities in a smooth surface) in a shorter time regardless of a plane orientation thereof.

[6] In the method, the method for removing at least a part of the non-diamond carbon may be at least one of a method for treating the non-diamond carbon with a gas phase fluid containing a gas containing at least one selected from the group consisting of an oxygen molecule, a hydrogen molecule, and a water molecule, a method for treating the non-diamond carbon with a gas phase fluid containing a plasma containing at least one selected from the group consisting of an oxygen atom, a hydrogen atom, a helium atom, and an argon atom, a method for treating the non-diamond carbon with an ion beam containing at least one selected from the group consisting of an oxygen ion, a hydrogen ion, a hydroxide ion, a helium ion, and an argon ion, and a method for removing the non-diamond carbon according to at least one of mechanical and physical treatments. Such a method can more smoothly process the surface of the solid carbon-containing material (in, for example, a smooth shape or a shape having desired irregularities in a smooth surface) in a shorter time regardless of a plane orientation thereof.

[7] In the method, a portion from which the non-diamond carbon is removed may be a part of the surface. Such a method can smoothly process the surface of the solid carbon-containing material (in, for example, a smooth shape or a shape having desired irregularities in a smooth surface) in a short time regardless of a plane orientation thereof.

[8] In the method, the method for removing at least a part of the non-diamond carbon may be at least one of a treating method using a gas phase fluid having a diameter smaller than a radius of an inscribed circle on the surface of the solid carbon-containing material, a treating method using an ion beam having a diameter smaller than a radius of an inscribed circle on the surface of the solid carbon-containing material, and a method for utilizing a mask having an opening having a circumscribed circle with a diameter smaller than a radius of an inscribed circle of the solid carbon-containing material. Such a method can more smoothly process the surface of the solid carbon-containing material (in, for example, a smooth shape or a shape having desired irregularities in a smooth surface) with high accuracy regardless of a plane orientation thereof.

[9] A body obtained by processing a solid carbon-containing material according to another embodiment of the present disclosure, includes a processed surface, at least a part of the processed surface being composed of solid carbon, wherein: the processed surface of the body obtained by processing a solid carbon-containing material has a smooth shape having a maximum height of less than or equal to 20 µm of small irregularities formed in the processed surface, or a shape having irregularities formed by a smooth surface in the processed surface and having a minimum height of greater than or equal to 30 µm; and the processed surface has a size of greater than or equal to 1 mm square (referred to as a square having a side of 1 mm, the same shall apply hereinafter), and a density of polishing damage points in the processed surface is less than or equal to 10 points/ mm². Here, the small irregularities formed in the smooth processed surface refer to small irregularities unintentionally formed by the method for producing a body obtained by processing a solid carbon-containing material and having a maximum height of less than or equal to 20 µm. The maximum height of the small irregularities refers to a distance between a base plane being parallel to the least square plane of the processed surface and passing through a vertex of a maximum small recessed part of the processed surface and a vertex of a maximum small protrusion part of the processed surface. The irregularities formed by the smooth surface in the processed surface refer to irregularities intentionally formed by the method for producing a body obtained by processing a solid carbon-containing material and having a minimum height of greater than or equal to 30 µm. The minimum height of the irregularities refers to a distance between a base plane being parallel to the least square plane of the processed surface and passing through a vertex of a minimum recessed part of the processed surface and a vertex of a minimum protrusion part of the processed surface. The smooth surface in which the irregularities are formed includes a smooth shape having the maximum height of less than or equal to 20 µm of the small irregularities. The body obtained by processing a solid carbon-containing material of the present embodiment has a smooth processed surface (for example, a smooth shape or a shape having desired irregularities in a smooth surface) having high crystal quality regardless of a plane orientation thereof.

[10] In the body obtained by processing a solid carbon-containing material, a density of metal atoms in the processed surface may be greater than or equal to 1 ppb. When such a body obtained by processing a solid carbon-containing material is processed after the metal layer is formed, the processed surface contains metal atoms having a certain level or higher of density.

[11] In the body obtained by processing a solid carbon-containing material, the processed surface may have a periodic small irregularities curved surface. Such a body obtained by processing a solid carbon-containing material has a smooth processed surface (for example, a smooth shape or a shape having desired irregularities in a smooth surface) regardless of a plane orientation thereof.

[12] In the body obtained by processing a solid carbon-containing material, the processed surface may include a small recessed part bowing inward, and a small protrusion part bowing outward; and a total area of the small recessed part may be greater than or equal to 60% of a total area of the processed surface when the processed surface is viewed from a direction perpendicular to a least-square plane thereof. The body obtained by processing a solid carbon-containing material of the present embodiment has a smooth processed surface (for example, a smooth shape or a shape having desired irregularities in a smooth surface) regardless of a plane orientation thereof.

[13] In the body obtained by processing a solid carbon-containing material, the solid carbon may contain at least one of single crystal diamond and polycrystalline diamond. Such a body obtained by processing a solid carbon-containing material also has a smooth processed surface (for example, a smooth shape or a shape having desired irregularities in a smooth surface) regardless of a plane orientation thereof.

DETAILS OF EMBODIMENT OF PRESENT DISCLOSURE

Embodiment 1: Method for Producing Body Obtained by Processing Solid Carbon-Containing Material With reference to FIGS. 1 to 18, a method for producing a body obtained by processing a solid carbon-containing material according to an embodiment of the present disclosure includes: step S10 of preparing a solid carbon-containing material 10 having at least a surface composed of solid carbon; and step S20 of processing solid carbon-containing material 10. Step S20 of processing solid carbon-containing material 10 includes: sub-step S22 of forming non-diamond carbon 10*nd* by heat-treating the solid carbon in the surface of solid carbon-containing material 10; and sub-step S23 of removing at least a part of non-diamond carbon 10*nd*. Since the method for producing a body obtained by processing a solid carbon-containing material of the present embodiment is a method for chemically cutting a strong bond of carbon, and thereafter removing the carbon in the surface, the surface of solid carbon-containing material 10 can be smoothly processed in a short time regardless of a surface orientation thereof. That is, according to the method for producing a body obtained by processing a solid carbon-containing material of the present embodiment, a body obtained by processing a solid carbon-containing material 20 which has a surface smoothly processed (in, for example, a smooth shape or a shape having desired irregularities in a smooth surface) regardless of a plane orientation thereof is obtained in a short time.

(Step of Preparing Solid Carbon-Containing Material)

With reference to FIG. 1, and FIGS. 2(A) to 9(A), solid carbon-containing material 10 prepared in step S10 of preparing a solid carbon-containing material has at least a surface composed of solid carbon. Here, the solid carbon refers to carbon which exists as a solid, and includes SP3-combined carbon bonded by a SP3 hybrid orbital, and SP2-combined carbon bonded by a SP2 hybrid orbital, and the like. The solid carbon includes diamond carbon (SP3 combined carbon) and non-diamond carbon (carbon other than SP3 combined carbon). The diamond carbon includes diamond (SP3 combined carbon). The non-diamond carbon includes diamond-like carbon (DLC: mixture of SP3-combined carbon and SP2-combined carbon), glassy carbon (mixture of SP3-combined carbon and SP2-combined carbon), graphite (SP2-combined carbon), graphene (SP2-bonded carbon), carbon black, activated carbon, and carbon fiber and the like. The solid carbon-containing material to be prepared may have a bulk shape, a plate shape including a thin film shape, or an indefinite shape. The solid carbon-containing material may have a surface having irregularities with a minimum height of greater than or equal to 30 µm. The solid carbon-containing material may have a flat surface or a curved surface with a minimum height of less than or equal to 20 µm of small irregularities. The step of preparing a solid carbon-containing material provides a body obtained by processing a solid carbon-containing material, which is obtained by smoothly processing the surface of the solid carbon-containing material (in, for example, a smooth shape or a shape having desired irregularities in a smooth surface) regardless of a plane orientation thereof.

The solid carbon constituting at least the surface of solid carbon-containing material 10 may contain at least one of SP3 combined solid carbon (for example, diamond carbon 10*d*) and SP2 combined solid carbon. Even if the solid carbon contains at least one of the SP3 combined solid carbon and the SP2 combined solid carbon, the surface of solid carbon-containing material 10 can be more smoothly processed (in, for example, a smooth shape or in a shape having desired irregularities in a smooth surface) in a short time regardless of a plane orientation thereof.

Solid carbon-containing material 10 may contain diamond carbon 10*d*, that is, contain at least one of single crystal diamond and polycrystalline diamond. Even if solid carbon-containing material 10 contains at least one of the single crystal diamond and the polycrystalline diamond, the surface of solid carbon-containing material 10 can be smoothly processed (in, for example, a smooth shape or in a shape having desired irregularities in a smooth surface) in a short time regardless of a plane orientation thereof.

(Step of Processing Solid Carbon-Containing Material)

With reference to FIGS. 1, 2(B) and 2(C), 3(B) to 3(D) to 9(B) to 9(D), 10(A) to 10(D) to 15(A) to 15(D), 16, 17, and 18(A) to 18(D), a step of processing solid carbon-containing material 10 includes a sub-step of forming non-diamond carbon 10*nd* by heat-treating the solid carbon in the surfaces of solid carbon-containing materials 10, 10A, 10B, 10C, and a sub-step of removing at least a part of non-diamond carbon 10*nd*. By such a sub-step, the surface of solid carbon-containing material 10 can be smoothly processed (in, for example, a smooth shape or in a shape having desired irregularities in a smooth surface) in a short time regardless of a plane orientation thereof.

Here, a sub-step of removing at least a part is required in order to smoothly process the surface of solid carbon-containing material 10 (in, for example, a smooth shape or in a shape having desired irregularities in a smooth surface) regardless of a plane orientation thereof. This is because, even if an entire non-flat surface is uniformly processed, it is difficult to obtain a smooth processed surface, and even if an entire surface having a non-desired shape is uniformly processed, it is significantly difficult to obtain a processed surface having a desired shape. That is, this is because it is necessary to intentionally process the surface so as to have a smooth shape or a desired shape in a smooth surface. Even if not a part of the surface but the entire surface is processed, non-uniform processing, that is, inhomogeneous processing in which fastest processing is provided at the center of a processed part and rapidly slow processing is provided at the periphery of the processed part is used, whereby this can be scanned at a desired position in a desired time to provide processing in a desired shape.

In a sub-step of forming non-diamond carbon 10*nd*, an oxygen partial pressure in an atmosphere for heat-treating the solid carbon is not particularly limited, but it is preferably less than or equal to 0.133 Pa, more preferably less than or equal to 0.0133 Pa, and still more preferably less than or equal to 0.000133 Pa from the viewpoint of improving processing accuracy in a smooth shape or a desired shape by forming uniform non-diamond carbon 10*nd*. Here, the reason why the oxygen partial pressure in the atmosphere for heat-treating the solid carbon is reduced is that, if the oxygen partial pressure is large, the non-diamond carbon formed by the heat treatment is uniformly removed. This is because, in order to provide accurate processing in a smooth shape or a desired shape, it is necessary not to uniformly remove the non-diamond carbon but to remove only the non-diamond carbon at a desired position. A smaller oxygen partial pressure causes an increased difference in removal rate between a desired position and an undesired position, which is preferable.

A temperature for the heat treatment is preferably higher than or equal to 300° C., more preferably higher than or equal to 600° C., and still more preferably higher than or equal to 800° C. from the viewpoint of processing the solid carbon-containing material in a short time. A higher temperature of the solid carbon in the heat treatment is preferable because the removal rate is faster.

Further, the temperature of a gas phase fluid used for the treatment is also preferably higher than room temperature, more preferably higher than or equal to 300° C., more preferably higher than or equal to 600° C., and still more preferably higher than or equal to 800° C. A higher temperature of the gas phase fluid used for the treatment is preferable because the removal rate is faster. However, when the oxygen partial pressure is greater than or equal to 0.0133 Pa, the solid carbon is more preferably treated with a gas phase fluid having a temperature as high as possible within a range where the temperature of the solid carbon is not higher than 600° C.

With reference to FIGS. 1, 5(B) and 5(C) to 8(B) and 8(C), 9(B), 12(A) to 12(C) to 14(A) to 14(C), 15(A) to 15(C), and 18(A), it is preferable that the step of processing solid carbon-containing material 10 further includes a sub-step of forming metal layers 10*mb* and 10*mc* on at least a part of the surface before the sub-step of forming non-diamond carbon 10*nd*. By such sub-step, the surface of solid carbon-containing material 10 can be more smoothly processed (in, for example, a smooth shape or a shape having desired irregularities in a smooth surface) in a shorter time regardless of a plane orientation thereof. This is because, if metal layers 10*mb* and 10*mc* are present, it is easier to form non-diamond carbon 10*nd* as compared with the case where no metal layer is present, whereby it is easy to indirectly remove diamond.

Here, with reference to FIGS. 5(B) and 5(C) to 7(B) and 7(C), 12(A) to 12(C), 13(A) to 13(C), and 15(A) to 15(C), metal layer 10*mb* preferably contains at least one metal element selected from the group consisting of Fe (iron), Co (cobalt), Ni (nickel), Rh (rhodium), Pd (palladium), Pt (platinum), Ir (iridium), and Mn (manganese), and more preferably contains at least one metal element selected from the group consisting of Fe (iron), Co (cobalt), and Ni (nickel). Such a metal element is a metal element in which solid carbon is easily solid-solved (hereinafter also referred to as a readily carbon solid-soluble metal element). For this reason, when a solid carbon-containing material 10B in which metal layer 10*mb* containing the readily carbon solid-soluble metal element is formed on at least a part of the surface is heat-treated, the solid carbon in solid carbon-containing material 10 in contact with metal layer 10*mb* is solid-solved in metal layer 10*mb*. When the solid-solved solid carbon is saturated, non-diamond carbon 10*nd* is deposited on the exposed surface of metal layer 10*mb* (the surface opposite to the surface in contact with the solid carbon-containing material). For this reason, by removing non-diamond carbon 10*nd*, the surface of solid carbon-containing material 10 can be smoothly processed (in, for example, a smooth shape or a shape having desired irregularities in a smooth surface) in a shorter time regardless of a plane orientation thereof. Here, the temperature of the heat treatment using metal layer 10*mb* containing the readily carbon solid-soluble metal element is preferably higher than or equal to 600° C., more preferably higher than or equal to 800° C., and still more preferably higher than or equal to 1000° C. from the viewpoint of processing the solid carbon-containing material in a short time.

With reference to FIGS. 8(B) and 8(C), 9(B), 14(A) and 14(C), and 16(A) and 16(B), a metal layer 10mc preferably contains at least one metal element selected from the group consisting of Ti (titanium), Zr (zirconium), Hf (hafnium), V (vanadium), Nb (niobium), Ta (tantalum), Cr (chromium), Mo (molybdenum), and W (tungsten), and more preferably contains at least one metal element selected from the group consisting of Ti, Zr, and Hf. Such a metal element is a metal element which is likely to react with solid carbon to form a metal carbide (hereinafter also referred to as an easily carbonizable metal element). For this reason, when solid carbon-containing material 10B in which metal layer 10mc containing the easily carbonizable metal element is formed on at least a part of the surface is heat-treated, the solid carbon in solid carbon-containing material 10 in contact with metal layer 10mb reacts with the easily carbonizable metal element to form the metal carbide which is non-diamond carbon 10nd. For this reason, by removing non-diamond carbon 10nd, the surface of solid carbon-containing material 10 can be more smoothly processed (in, for example, a smooth shape or a shape having desired irregularities in a smooth surface) in a shorter time regardless of a plane orientation thereof. Here, the temperature of the heat treatment using metal layer 10mc containing the easily carbonizable metal element is preferably higher than or equal to 300° C., more preferably higher than or equal to 600° C., and still more preferably higher than or equal to 800° C. from the viewpoint of processing the solid carbon-containing material in a short time.

Figure 20A:
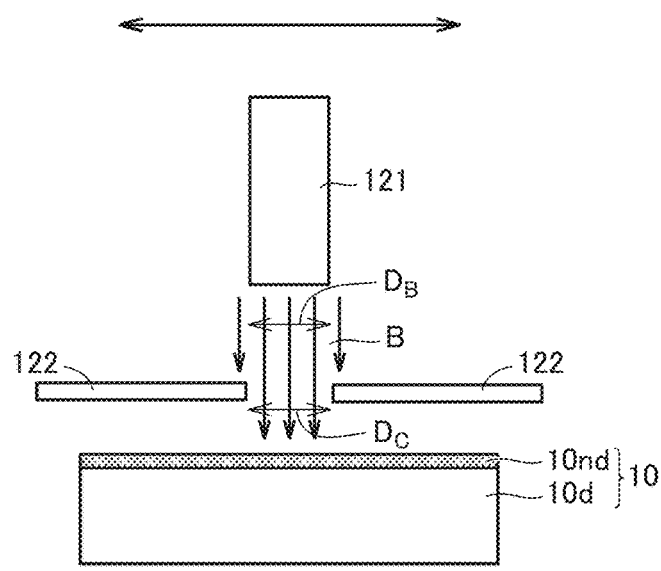
FIG. 20A is a schematic view showing an example of a method for removing at least a part of non-diamond carbon in a method for producing a body obtained by processing a solid carbon-containing material according to one aspect of the present disclosure.
Figure 21:
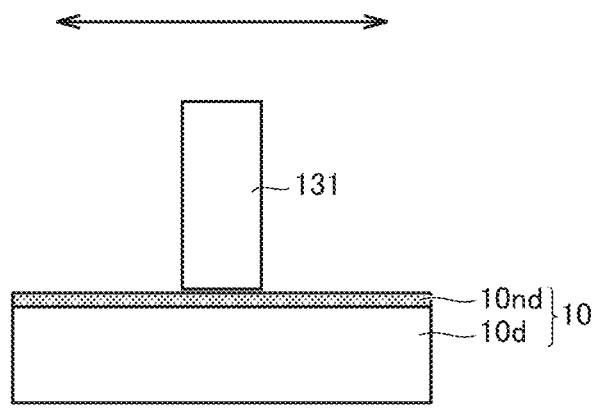
FIG. 21 is a schematic view showing an example of a method for removing at least a part of non-diamond carbon in a method for producing a body obtained by processing a solid carbon-containing material according to one aspect of the present disclosure.

Further, in the sub-step of removing at least a part of non-diamond carbon 10nd shown in FIGS. 2(B) and 2(C), 3(C) and 3(D) to 9(C) and 9(D), 10(B) to 10(D) to 15(B) to 15(D), and 18(C) and 18(D), the method for removing at least a part of non-diamond carbon 10nd is preferably at least one of a method for treating non-diamond carbon 10nd with a gas phase fluid F of higher than or equal to 500° C. containing a gas containing at least one selected from the group consisting of an $O_2$ (oxygen) molecule, a $H_2$ (hydrogen) molecule, and a $H_2O$ (water) molecule (FIG. 19A), a method for treating non-diamond carbon 10 nd with a gas phase fluid F containing a plasma containing at least one selected from the group consisting of an O (oxygen) atom, a H (hydrogen) atom, a He (helium) atom, and an Ar (argon) atom (FIG. 19A), a method for treating non-diamond carbon 10nd with an ion beam B containing at least one selected from the group consisting of an O (oxygen) ion, a H (hydrogen) ion, an OH (hydroxide) ion, a He (helium) ion, and an Ar (argon) ion (FIG. 20A), and a method for removing non-diamond carbon 10nd according to at least one of mechanical and physical treatments (FIG. 21). Such a method can more smoothly process the surface of the solid carbon-containing material (in, for example, a smooth shape or a shape having desired irregularities in a smooth surface) in a shorter time regardless of a plane orientation thereof.

Figure 19A:
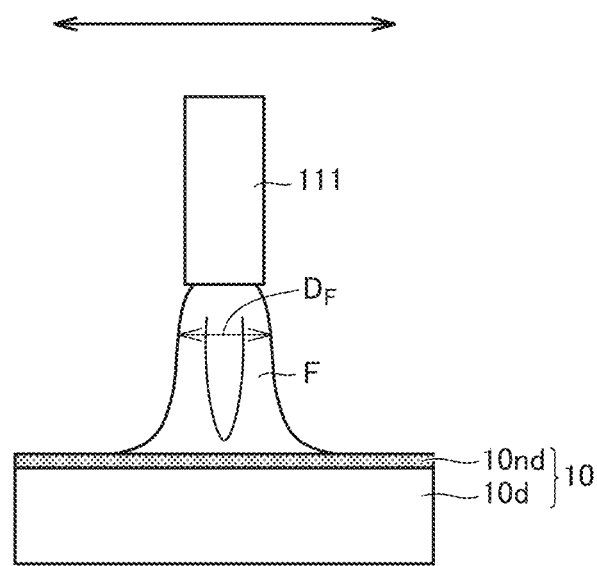
FIG. 19A is a schematic view showing an example of a method for removing at least a part of non-diamond carbon in a method for producing a body obtained by processing a solid carbon-containing material according to one aspect of the present disclosure.

With reference to FIG. 19A, the method for treating non-diamond carbon 10nd with a gas phase fluid F of higher than or equal to 500° C. containing a gas containing at least one selected from the group consisting of an $O_2$ molecule, a $H_2$ molecule, and a $H_2O$ molecule, or a method for treating non-diamond carbon 10nd with a gas phase fluid F containing a plasma containing at least one selected from the group consisting of an O atom, a H atom, a He torn, and an Ar atom is, for example, a method for removing non-diamond carbon 10nd formed on the surface by spraying gas phase fluid F onto the surface of solid carbon-containing material 10 from a fluid spraying part 111. Here, gas phase fluid F can be scanned by moving fluid spraying part 111 relative to solid carbon-containing material 10.

With reference to FIG. 20A, the method for treating non-diamond carbon 10nd with an ion beam B containing at least one selected from the group consisting of an O ion, a H ion, an OH ion, a He ion, and an Ar ion is, for example, a method for removing non-diamond carbon 10nd formed on the surface by irradiating the surface of solid carbon-containing material 10 with ion beam B from a beam radiating part 121. Here, from the viewpoint of improving the processing accuracy by reducing the radiation diameter of ion beam B, a mask 122 having an opening can be used. Ion beam B can be scanned by moving beam radiating part 121 and/or mask 122 relative to solid carbon-containing material 10.

With reference to FIG. 21, the method for removing non-diamond carbon 10nd according to at least one of mechanical and physical treatments is a method for removing non-diamond carbon 10nd formed on the surface by reciprocating and/or rotating a removal tool 131 such as a grindstone with respect to solid carbon-containing material 10 while pressing removal tool 131 against the surface of solid carbon-containing material 10. Here, removal tool 131 can be scanned by moving removal tool 131 relative to solid carbon-containing material 10.

It is preferable that a portion from which non-diamond carbon 10nd is removed is a part of the surface. Such a method for producing a body obtained by processing a solid carbon-containing material can smoothly process the surface of the solid carbon-containing material in a desired shape in a short time regardless of a plane orientation thereof. This is because, when a smooth surface is formed, the previous surface is not smooth and a part thereof is first removed, and when a desired shape is formed, a curved surface shape is indicated, and a part thereof is removed as a premise.

Figure 22:
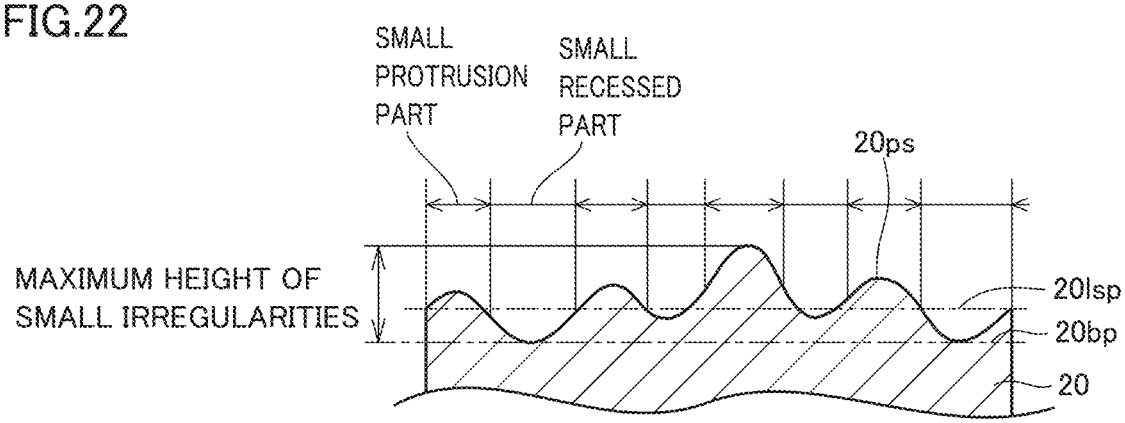
FIG. 22 is a schematic cross-sectional view showing an example of small irregularities formed in a processed surface of a body obtained by processing a solid carbon-containing material according to one aspect of the present disclosure.
Figure 24:
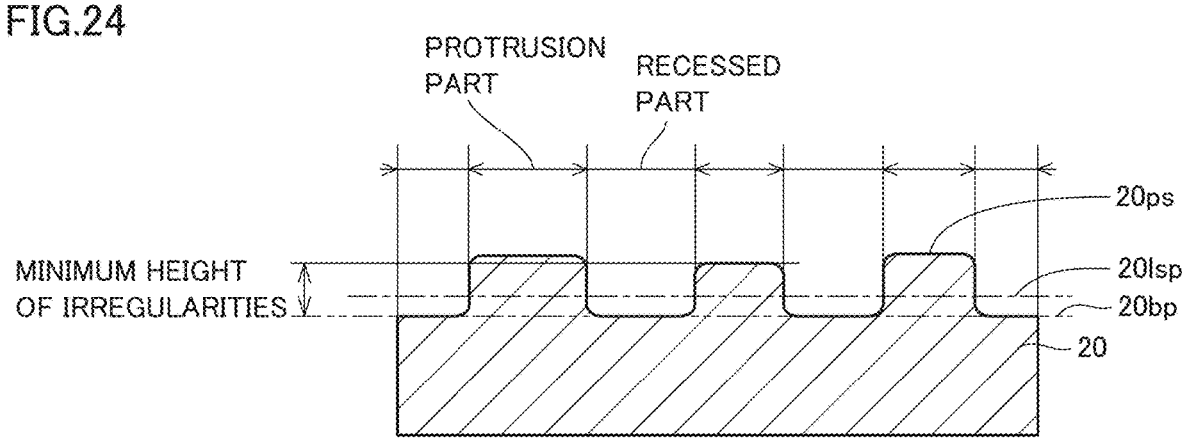
FIG. 24 is a schematic cross-sectional view showing an example of irregularities formed in a processed surface of a body obtained by processing a solid carbon-containing material according to one aspect of the present disclosure.

Further, with reference to FIGS. 22 and 24, the shape of the processed surface of a body obtained by processing a solid carbon-containing material 20 after removing non-diamond carbon 10nd is preferably a smooth shape having the maximum height of less than or equal to 20 µm of small irregularities formed in the processed surface, or a shape having irregularities with a minimum height of greater than or equal to 30 µm formed as a smooth surface in the processed surface. Here, as shown in FIG. 22, small irregularities formed in a smooth processed surface 20ps refers to small irregularities which are unintentionally formed by the method for producing the body obtained by processing a solid carbon-containing material and have a maximum height of less than or equal to 20 µm. The maximum height of the small irregularities refers to a distance between a base plane 20bp being parallel to a least square plane 201sp of processed surface 20ps and passing through a vertex of a maximum small recessed part of processed surface 20ps and a vertex of a maximum small protrusion part of the processed surface. Also, as shown in FIG. 24, irregularities formed by a smooth surface in processed surface 20ps refer to irregularities which are intentionally formed by the method for producing a body obtained by processing a solid carbon-containing material and have a minimum height of greater than or equal to 30 µm. The minimum height of the irregularities refers to a distance between base plane 20bp being parallel to least square plane 201sp of processed surface 20ps and passing through the vertex of the minimum recessed part of processed surface 20ps and the vertex of the minimum protrusion part of the processed surface. The smooth surface in which the irregularities are formed includes a smooth shape having the maximum height of less than or equal to 20 μm of the small irregularities. Such a method for producing a body obtained by processing a solid carbon-containing material can more smoothly process the surface of the solid carbon-containing material (in, for example, a smooth shape or a shape having desired irregularities in a smooth surface) in a short time regardless of a plane orientation thereof.

From the above viewpoint, when processed surface 20*ps* of body obtained by processing a solid carbon-containing material 20 has a smooth shape, the maximum height of the small irregularities formed in smooth processed surface 20*ps* is preferably less than or equal to 20 μm, more preferably less than or equal to 10 μm, still more preferably less than or equal to 5 μm, yet still more preferably less than or equal to 3 μm, further preferably less than or equal to 1 and particularly preferably less than or equal to 0.1 μm. When processed surface 20*ps* of body obtained by processing a solid carbon-containing material 20 has irregularities formed by a smooth surface, the minimum height of the irregularities of processed surface 20*ps* is preferably greater than or equal to 30 μm, more preferably greater than or equal to 50 μm, and still more preferably greater than or equal to 100 μm. In the processed surface, the maximum height of the irregularities of a smooth portion can be set to be less than or equal to 0.1 and the minimum height of the irregularities of the portion having smooth irregularities can also be set to be greater than or equal to 100 μm. The parallelism of the body obtained by processing is preferably less than or equal to 0.5°, more preferably less than or equal to 0.3°, still more preferably less than or equal to 0.25°, and particularly preferably less than or equal to 0.1°. The accuracy of processing as described above varies depending on the type of a metal on which a non-diamond layer is formed. If the solid solubility or diffusivity of carbon in a metal is large, the accuracy of flat processing tends to be high. It is difficult to achieve these processing accuracies at a density of polishing damage points kept at less than or equal to 10 points/mm$^2$, or it is more difficult to achieve the processing accuracies at a density of polishing damage points kept at 0 point/mm$^2$. The processing accuracies are achieved by the method for producing a body obtained by processing a solid carbon-containing material of the present embodiment.

Figure 23:
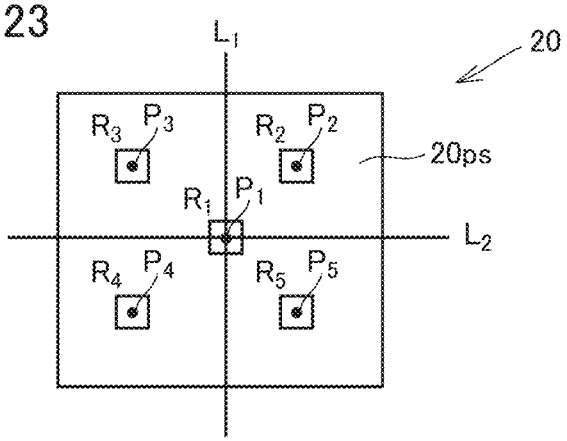
FIG. 23 is a schematic top view showing an example of a range in which a maximum height of small irregularities formed in a processed surface of a body obtained by processing a solid carbon-containing material according to one aspect of the present disclosure is measured with a scanning white light interferometer.

The maximum height of the small irregularities formed in smooth processed surface 20*ps* and the minimum height of the irregularities formed by a smooth surface in processed surface 20*ps* can be measured by a laser displacement meter (for example, a surface shape measuring system Dyvoce-3000 manufactured by Kohzu Precision Co., Ltd. or its equivalent). However, since the measurement accuracy of the laser displacement meter is about 1 μm, a scanning white light interferometer (for example, Zygo New View 200 manufactured by Canon Inc. or its equivalent) is suitably used for measuring the height of small irregularities of less than 1 μm. The scanning white light interferometer causes difficult measurement of the height of the small irregularities in a wide area, and makes measurements in a plurality of narrow areas. For example, with reference to FIG. 23, the maximum height of the small irregularities by the scanning white light interferometer is taken as a maximum height measured and obtained in five ranges $R_1$, $R_2$, $R_3$, $R_4$, $R_5$ of 0.4-mm square (referred to as a square having a side of 0.4 mm, the same shall apply hereinafter) centered on a centroid point $P_1$ of processed surface 20*ps* to be measured and four centroid points $P_2$, $P_3$, $P_4$, $P_5$ of four areas divided by two straight lines $L_1$ and $L_2$ orthogonal to each other at centroid point $P_1$.

Figure 19B:
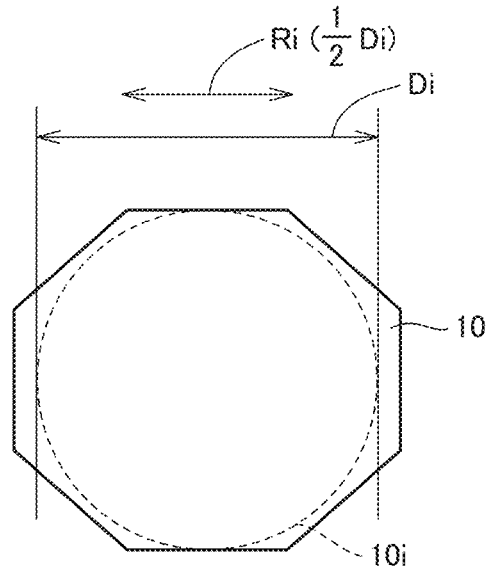
FIG. 19B is a schematic view showing an example of an inscribed circle on the surface of a solid carbon-containing material in a method for removing at least a part of non-diamond carbon in a method for producing a body obtained by processing a solid carbon-containing material according to one aspect of the present disclosure.
Figure 20B:
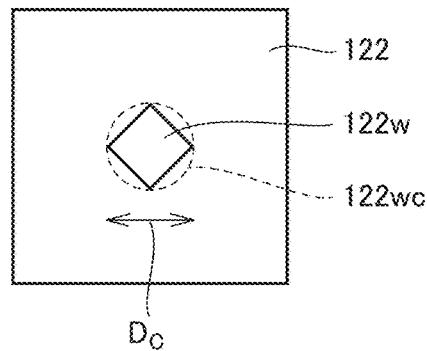
FIG. 20B is a schematic view showing an example of a circumscribed circle of an opening of a mask utilized in a method for removing at least a part of non-diamond carbon in a method for producing a body obtained by processing a solid carbon-containing material according to one aspect of the present disclosure.
Figure 20C:
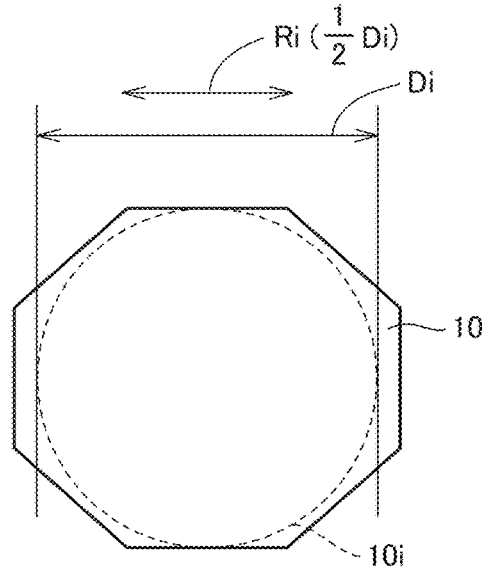
FIG. 20C is a schematic view showing an example of an inscribed circle on the surface of a solid carbon-containing material in a method for removing at least a part of non-diamond carbon in a method for producing a body obtained by processing a solid carbon-containing material according to one aspect of the present disclosure.

Further, a method for removing at least a part of the non-diamond carbon is preferably at least one of a treating method using a plasma jet (gas phase fluid F) having a diameter $D_F$ smaller than a radius Ri of an inscribed circle 10*i* on the surface of solid carbon-containing material 10 (see FIGS. 19A and 19B), a treating method using an ion beam 13 having a diameter $D_B$ smaller than a radius Ri of an inscribed circle 10*i* on the surface of solid carbon-containing material 10 (see FIGS. 20A and 20C), and a method for utilizing a mask 122 having an opening 122*w* having a circumscribed circle 122*wc* with a diameter smaller than a radius $R_i$ of an inscribed circle 10*i* of solid carbon-containing material 10 (see FIGS. 20A, 20B, and 20C). Such a method can more smoothly process the surface of the solid carbon-containing material (in, for example, a smooth shape or a shape having desired irregularities in a smooth surface) with high accuracy regardless of a plane orientation thereof.

Embodiment 1A

With reference to FIGS. 1, 2 to 4, 10, and 11, in a more specific embodiment 1A, in step S20 for processing a solid carbon-containing material 10 having at least a surface composed of a material containing diamond carbon 10*d*, by the sub-step of forming non-diamond carbon 10*nd* by heat-treating diamond carbon 10*d* in the surface of solid carbon-containing material 10 (FIGS. 2(B) to 4(B), 10(A), and 11(A)), a solid carbon-containing material 10A having non-diamond carbon 10*nd* formed on the surface is obtained. By the sub-step of removing at least a part of non-diamond carbon 10*nd* from solid carbon-containing material 10A (FIGS. 2(C), 3(C) and 3(D), 4(C) and 4(D), 10(B) and 10(B), and 11(B) and 11(D)), a body obtained by processing a solid carbon-containing material 20 (FIGS. 2(C), 3(D), 4(D), 10(D), and 11(D)) is obtained. In this manner, body obtained by processing a solid carbon-containing material 20 is obtained by smoothly processing the surface of solid carbon-containing material 10 (in, for example, a smooth shape or a shape having desired irregularities in a smooth surface) in a short time regardless of a plane orientation thereof.

In the steps shown in FIGS. 2 to 4, 10, and 11, diamond carbon 10*d* is most effective when a diamond bond material is 100%. This is because, in the sub-step of removing non-diamond carbon, processing in a desired shape is facilitated by utilizing a feature that the removal efficiency of the non-diamond carbon is much greater than the removal efficiency of the diamond carbon. The removal efficiencies of the non-diamond carbon and diamond carbon are very easily changed. This is because, even under the same condition, the non-diamond carbon is generally more easily removed.

Within the same time, the non-diamond carbon is easily removed, so that the removal almost stops at the diamond carbon.

FIGS. 2(C), 3(D), 4(D), 10(D), and 11(D) show a case where non-diamond carbon 10*nd* formed in the surface of solid carbon-containing material 10 is wholly removed. FIGS. 3(C), 4(C), 10(B), and 11(B) show a case where a part of non-diamond carbon 10*nd* formed in the surface of solid carbon-containing material 10 is removed. Here, the method for removing a part of non-diamond carbon 10*nd* is not particularly limited, but from the viewpoint of improving processing accuracy, or from the viewpoint of producing a controlled flat surface (intended flat surface) or a controlled curved surface (intended curved surface), a processing method using a plasma jet or ion beam having a small diameter, a method using a mask having a small opening, a mechanical removing method and the like are preferable. The mechanical removing method also provides very easy processing. This is because non-diamond carbon 10*nd* is very soft and has largely different hardness from that of diamond carbon 10*d*. However, processing waste does not fly away without gasifying, which makes it necessary to devise measures such as blowing away the processing waste.

Solid carbon-containing material 10A in which a part of non-diamond carbon 10*nd* formed on the surface of solid carbon-containing material 10 shown in FIGS. 3(B) and 4(B) is removed by etching and the like to expose diamond carbon 10*d* is further heat-treated as shown in FIGS. 3(C) and 4(C) to form non-diamond carbon 10*nd* on the surface of exposed diamond carbon 10*d*. Newly formed non-diamond carbon 10*nd* is further removed by the same method as described above. In this manner, by repeatedly forming and removing non-diamond carbon 10*nd* in a desired portion of the surface of solid carbon-containing material 10, the surface can be processed in a desired shape.

Figure 10:
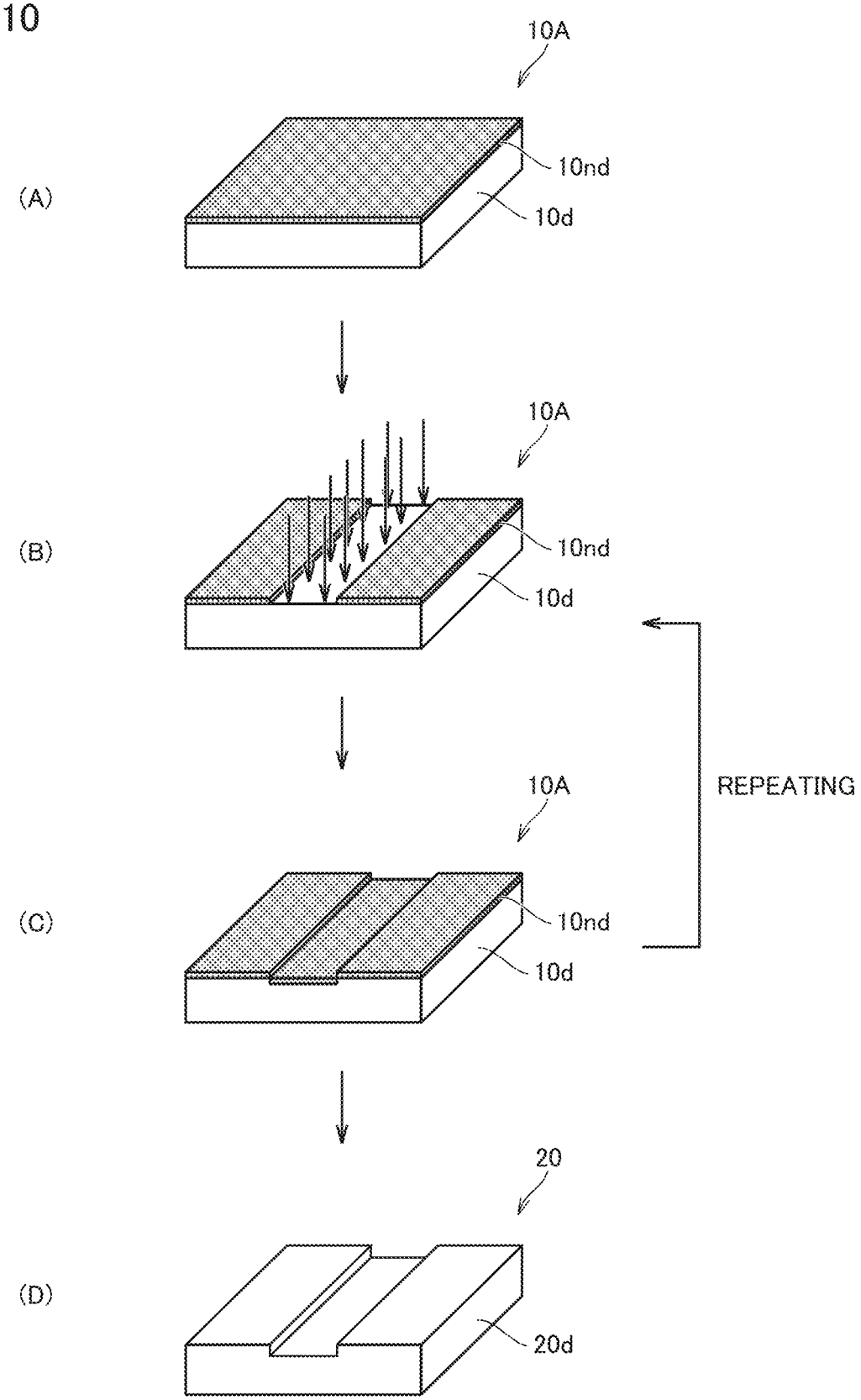
FIG. 10 is a schematic three-dimensional view showing an example of a method for producing a body obtained by processing a solid carbon-containing material according to one aspect of the present disclosure.
Figure 11:
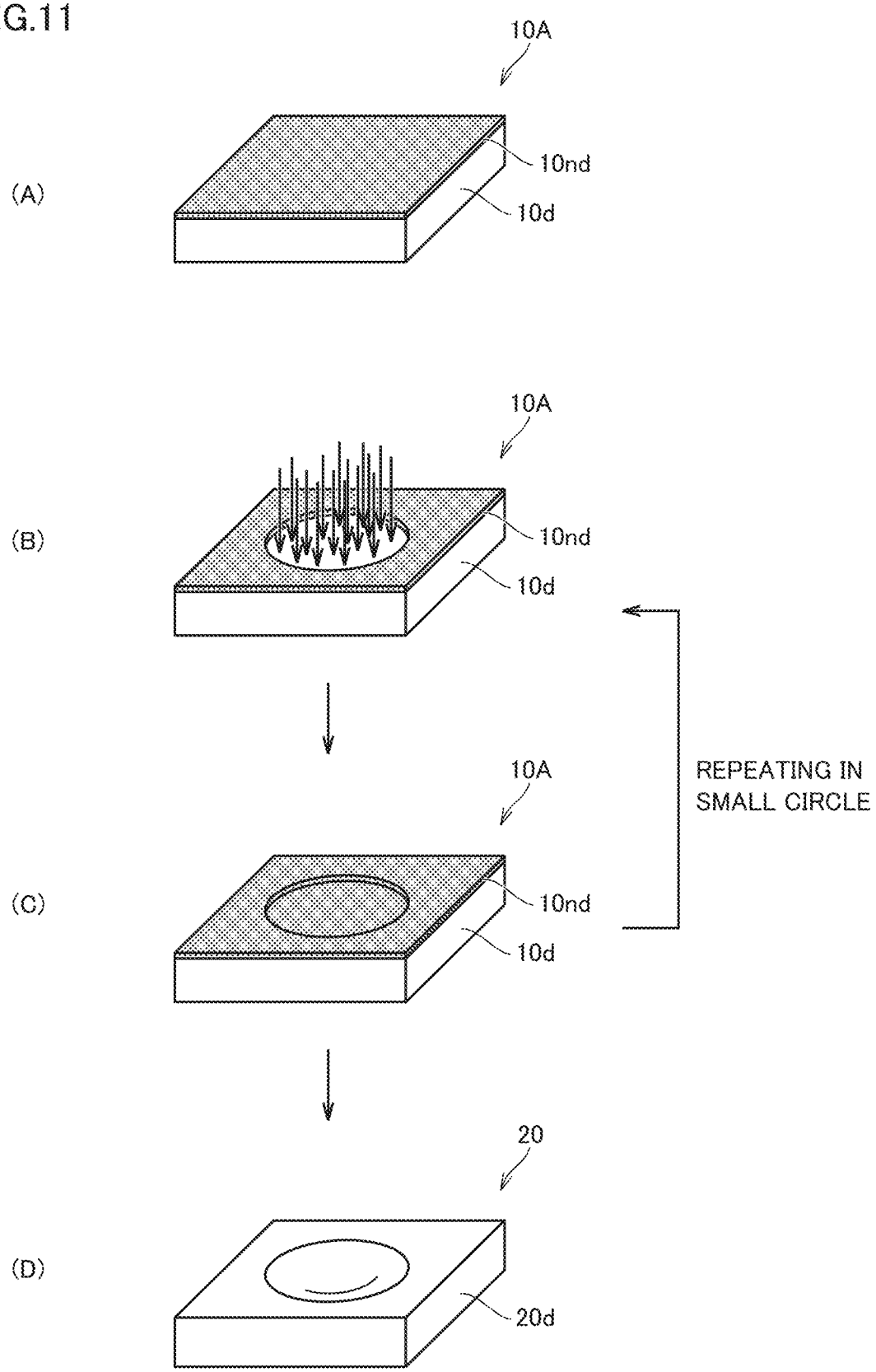
FIG. 11 is a schematic three-dimensional view showing an example of a method for producing a body obtained by processing a solid carbon-containing material according to one aspect of the present disclosure.

In the example shown in FIG. 10, a stepped processed body is formed by processing the same portion, but as in the example shown in FIG. 11, a fine stepped part is provided by processing a portion different from the first portion and the second portion. However, a processed body not having a single step but a three-dimensional shape having different several steps (having undulating contour lines) can also be obtained. The processed body having a wholly smooth three-dimensional shape can be obtained. Even in the example shown in FIG. 2, when the solid carbon-containing material is processed in changed shapes many times by a small-diameter plasma jet and the like, each single step is not steep, whereby one step is a smooth projection, and the processed body having wholly smoother irregularities can be formed. In the example shown in FIG. 4, if many protrusion portions are processed in the solid carbon-containing material having large irregularities in the surface, and recessed portions are hardly processed, the irregularities are reduced by repeating the process, whereby a flat and smooth surface can also be formed. Instead of repeating the above process, the non-diamond carbon is removed in an environment where the heat treatment is performed to form the non-diamond carbon, whereby the sub-step of forming the non-diamond carbon and the sub-step of removing the non-diamond carbon can also be caused to simultaneously proceed.

In the heat treatment of the solid carbon-containing materials 10, 10A of the embodiment 1A, an oxygen partial pressure in an atmosphere for heat-treating is preferably less than or equal to 0.133 Pa, more preferably less than or equal to 0.0133 Pa, and still more preferably less than or equal to 0.000133 Pa from the viewpoint of processing the solid carbon-containing material with high accuracy. A temperature for the heat treatment is preferably higher than or equal to 300° C., more preferably higher than or equal to 600° C., and still more preferably higher than or equal to 800° C. from the viewpoint of processing the solid carbon-containing material in a short time.

Embodiment 1B

With reference to FIGS. 1, 5 to 7, 12, 13, and 15, in a more specific embodiment 1B, in step S20 for processing a solid carbon-containing material 10 having at least a surface composed of a material containing diamond carbon 10*d*, by the sub-step of forming a metal layer 10*mb* containing at least one metal element (readily carbon solid-soluble metal element) selected from the group consisting of Fe, Co, Ni, Rh, Pd, Pt, Ir, and Mn on at least a part of the surface of solid carbon-containing material 10, a solid carbon-containing material 10B is obtained, in which metal layer 10*mb* containing the readily carbon solid-soluble metal element is formed on at least a part of the surface (FIGS. 5(B) to 7(B), 12(A), 13(A), and 15(A)).

Figure 16:
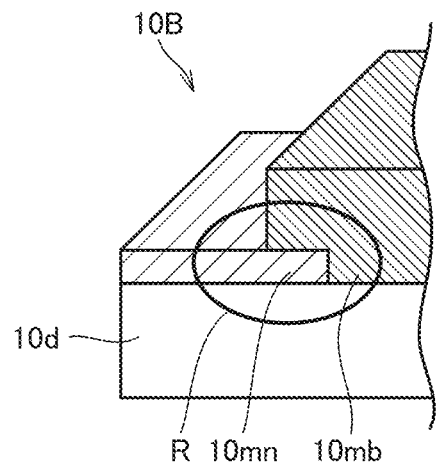
FIG. 16 is an enlarged schematic three-dimensional view showing an example of arrangement of a metal layer containing a readily carbon solid-soluble metal element and a metal layer containing no readily carbon solid-soluble metal element in a method for producing a body obtained by processing a solid carbon-containing material according to one aspect of the present disclosure.
Figure 17:
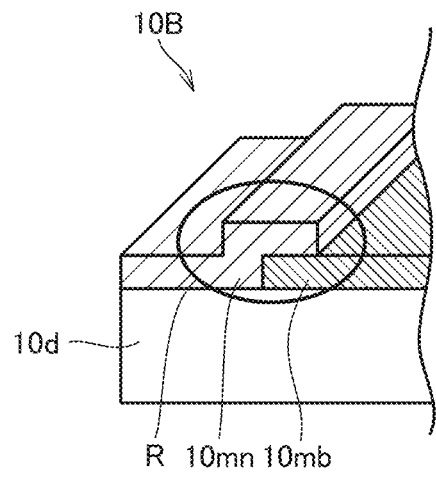
FIG. 17 is an enlarged schematic three-dimensional view showing an example of arrangement of a metal layer containing a readily carbon solid-soluble metal element and a metal layer containing no readily carbon solid-soluble metal element in a method for producing a body obtained by processing a solid carbon-containing material according to one aspect of the present disclosure.

Here, FIGS. 5(B) to 7(B), 12(A), and 13(A) show a case where metal layer 10*mb* is formed on the entire surface of solid carbon-containing material 10. FIG. 15(A) shows a case where metal layer 10*mb* is formed on a part of the surface of solid carbon-containing material 10. In this case, it is preferable to form a metal layer not containing a readily carbon solid-soluble metal element in the remaining portion other than the metal layer containing a readily carbon solid-soluble metal element. This is because the portion of the metal layer containing the readily carbon solid-soluble metal element is prevented from spreading into the metal layer not containing the readily carbon solid-soluble metal element as the carbon is removed. As shown in FIGS. 16 and 17, a metal layer 10*mn* not containing the readily carbon solid-soluble metal element is formed, so that the portion of metal layer 10*mn* not containing the readily carbon solid-soluble metal element does not solid-solve carbon. Therefore, the carbon is not processed, and even if metal layer 10*mb* containing the readily carbon solid-soluble metal element expands or deforms, metal layer 10*mn* not containing the readily carbon solid-soluble metal element blocks the metal layer 10*mb* so as to stop it.

The surface of solid carbon-containing material 10 may not be a surface which is 100% diamond. This is because the carbon solid-solved in the metal layer containing the readily carbon solid-soluble metal element does not depend on the hardness of the surface, so that the required amount of carbon is solid-solved in the same amount, and is processed in the same manner.

Diamond carbon 10*d* in the surface of solid carbon-containing material 10B is heat-treated, whereby solid carbon in solid carbon-containing material 10 in contact with metal layer 10*mb* is solid-solved in metal layer 10*mb*. When the solid-solved solid carbon is saturated, solid carbon-containing material 10B is obtained, in which non-diamond carbon 10*nd* is deposited on the exposed surface of metal layer 10*mb* (the surface opposite to the surface in contact with the solid carbon-containing material) (FIGS. 5(C), 6(B), 7(B), 12(A), 13(A), and 15(A)). When non-diamond carbon 10*nd* layer is formed on metal layer 10*mb* containing the readily carbon solid-soluble metal element, the solid solution of the solid carbon from the solid carbon-containing material 10 into metal layer 10*mb* stops. When non-diamond carbon 10*nd* layer formed on metal layer 10*mb* is removed, the solid solution of the solid carbon from solid carbon-containing material 10 into metal layer 10*mb* starts again. Non-diamond carbon 10*nd* layer formed on the surface of the metal layer containing the readily carbon solid-soluble metal element does not depend on the type of solid carbon-containing material 10 containing the diamond carbon below the metal layer. This is because the same precipitates on the same condition once the solid carbon is solid-solved in the metal layer containing the readily carbon solid-soluble metal element. Therefore, embodiment 1B has an advantage of being processed without depending on the lower part.

By the sub-step of removing at least a part of non-diamond carbon 10*nd* from solid carbon-containing material 10B (FIGS. 5(D), 6(B) and 6(D), 7(B) and 7(D), 12(B) and 12(D), 13(B) and 13(D), and 15(B) and 15(D)), a body obtained by processing a solid carbon-containing material 20 (FIGS. 5(D) to 7(D), 12(D), 13(D), and 15(D)) is obtained. In this manner, body obtained by processing a solid carbon-containing material 20 is obtained by smoothly processing the surface of solid carbon-containing material 10 (in, for example, a smooth shape or a shape having desired irregularities in a smooth surface) with high quality in a short time regardless of a plane orientation thereof. Here, FIGS. 5(D) to 7(D), 12(D), 13(D), and 15(B) and 15(D) show a case where metal layer 10*mb* containing the readily carbon solid-soluble metal element formed on the surface of solid carbon-containing material 10 and non-diamond carbon 10*nd* are wholly removed. FIGS. 6(C), 7(C), 12(B), and 13(B) show a case where a part of non-diamond carbon 10*nd* formed on the surface of metal layer 10*mb* containing the readily carbon solid-soluble metal element formed on the surface of solid carbon-containing material 10 is removed. Since the condition for removing the non-diamond carbon and the condition for removing the metal layer containing the readily carbon solid-soluble metal element are generally different from each other, the removal stops once under the condition for removing the non-diamond carbon, whereby every single step is easily caused to proceed in order. The method for removing a part of non-diamond carbon 10*nd* is not particularly limited, but from the viewpoint of improving processing accuracy, or from the viewpoint of producing a controlled flat surface (intended flat surface) or a controlled curved surface (intended curved surface), a processing method using a plasma jet or ion beam having a small diameter, a method using a mask having a small opening, and a mechanical removing method and the like are preferable. Here, since a gas phase fluid containing a plasma and an ion supplied from a small diameter processes the solid carbon-containing material, the processing accuracy is higher as the diameter thereof is smaller, or the gas phase fluid is supplied from a closer position.

Figure 12:
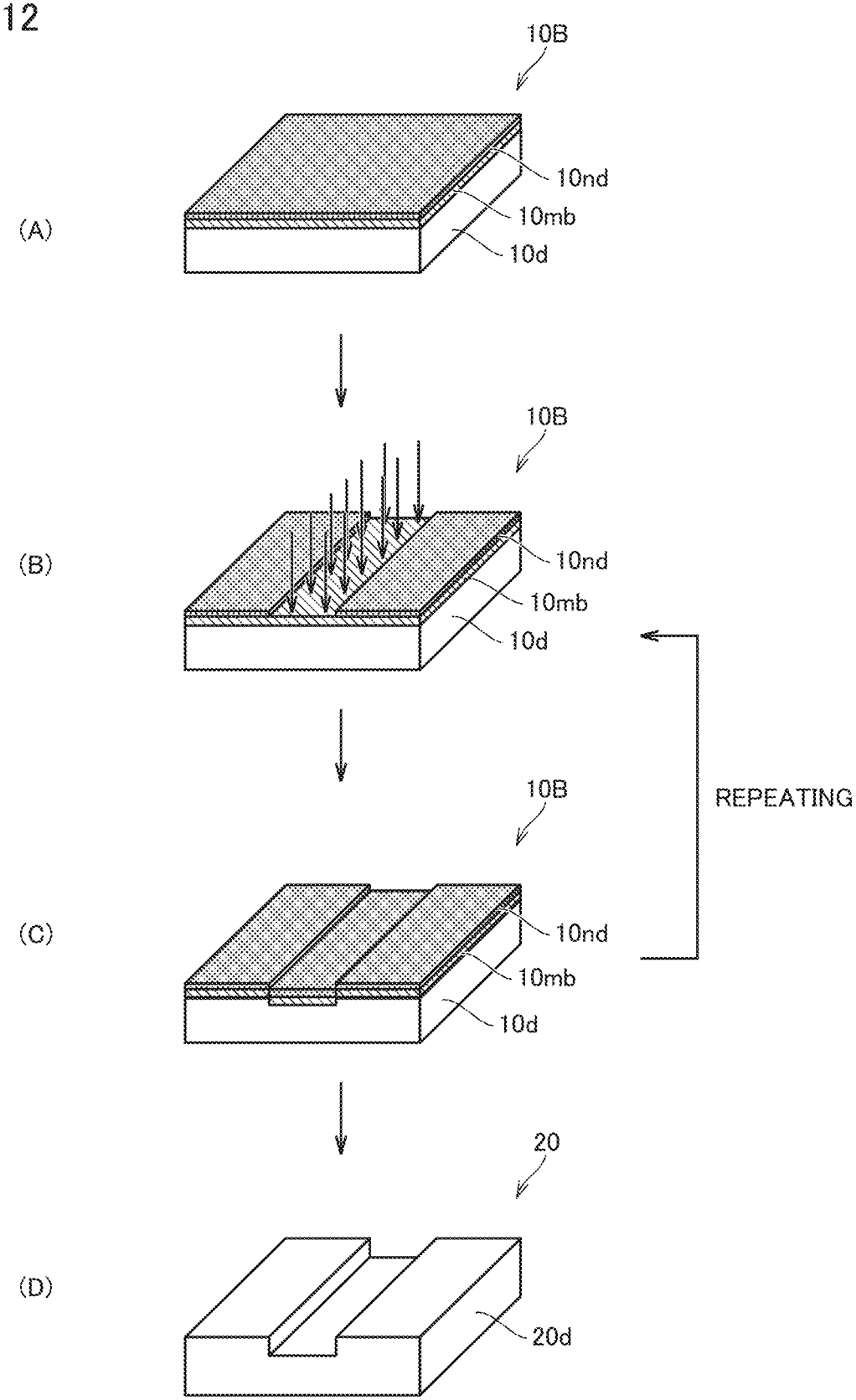
FIG. 12 is a schematic three-dimensional view showing an example of a method for producing a body obtained by processing a solid carbon-containing material according to one aspect of the present disclosure.
Figure 13:
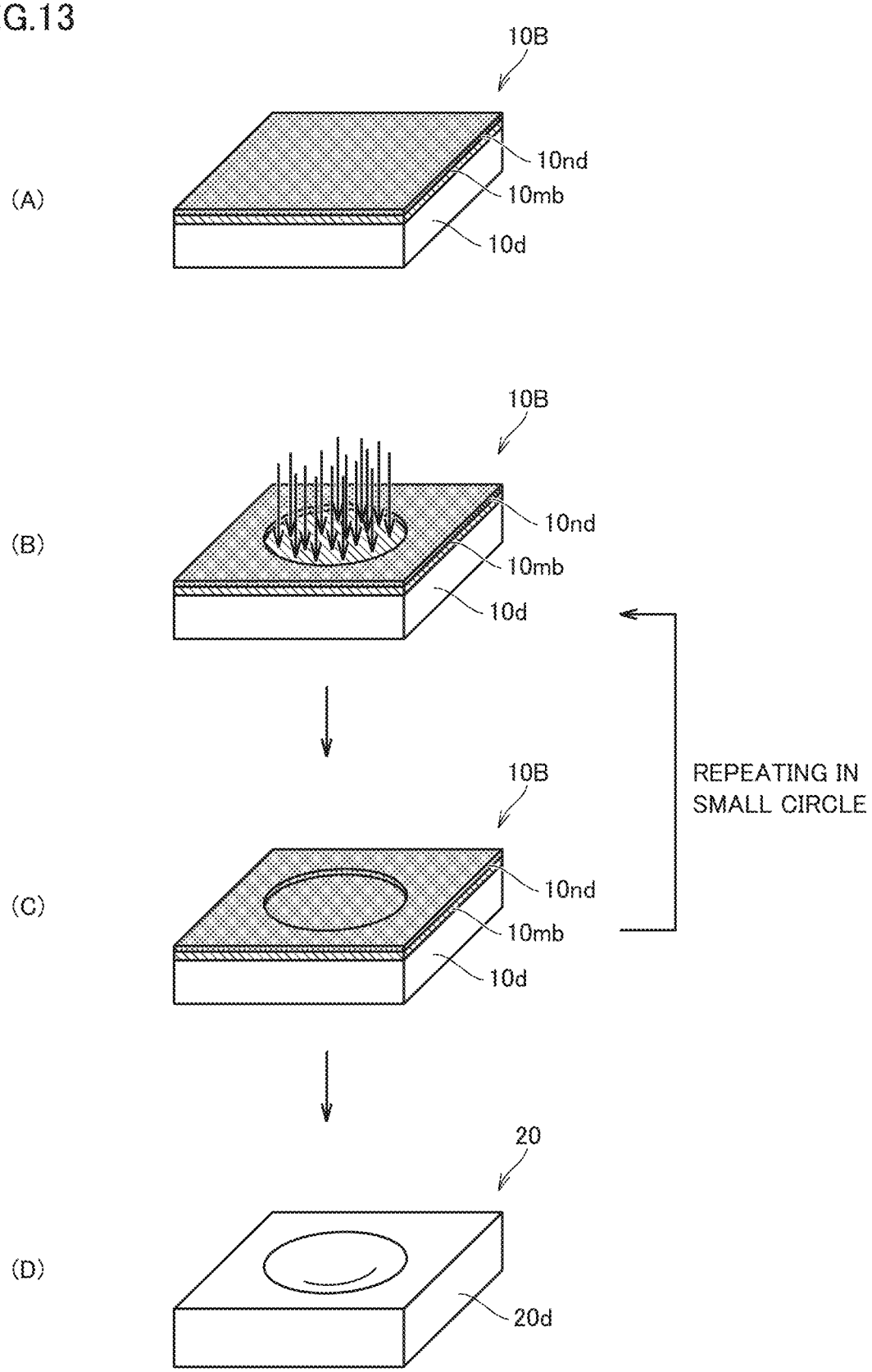
FIG. 13 is a schematic three-dimensional view showing an example of a method for producing a body obtained by processing a solid carbon-containing material according to one aspect of the present disclosure.

By further heat-treating solid carbon-containing material 10B in which a part of non-diamond carbon 10*nd* formed on the surface of metal layer 10*mb* of solid carbon-containing material 10B shown in FIG. 12(B) is removed by etching and the like to expose metal layer 10*mb*, non-diamond carbon 10*nd* is deposited on the surface of exposed metal layer 10*mb* as shown in FIG. 12(C). Newly formed non-diamond carbon 10*nd* layer is further removed in the same manner as described above. In this manner, in a desired portion of the surface of solid carbon-containing material 10, by repeating the deposition and removal of non-diamond carbon 10*nd* using metal layer 10*mb* containing the readily carbon solid-soluble metal element, the surface can be processed in a desired shape. In the example shown in FIG. 12, a stepped part is formed by processing the same portion, but as in the example shown in FIG. 13, a fine stepped part is provided by processing a portion different from the first portion and the second portion. However, a stepped part not having a single step but a three-dimensional shape having different several steps (having undulating contour lines) can also be processed. The processed body having a wholly smooth three-dimensional shape can be obtained.

Figure 5:
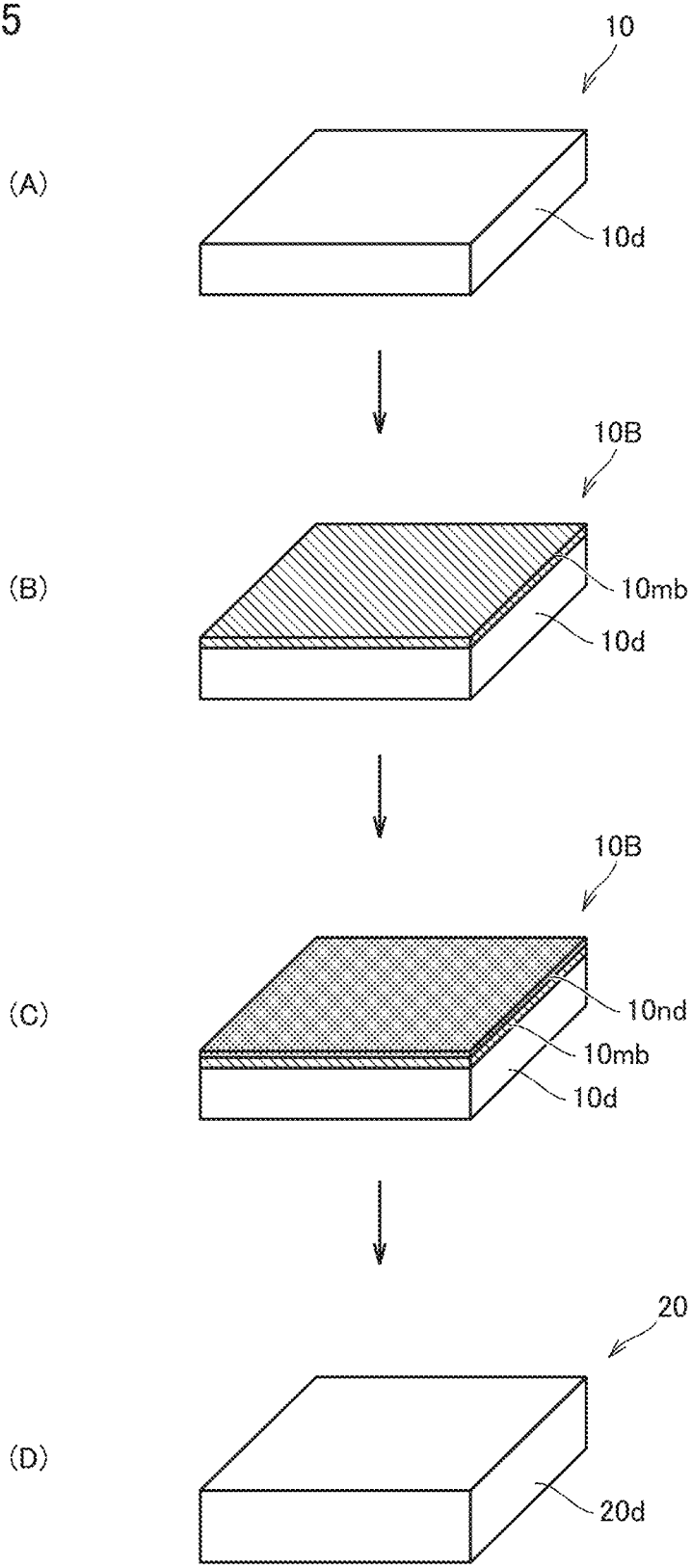
FIG. 5 is a schematic three-dimensional view showing an example of a method for producing a body obtained by processing a solid carbon-containing material according to one aspect of the present disclosure.
Figure 6:
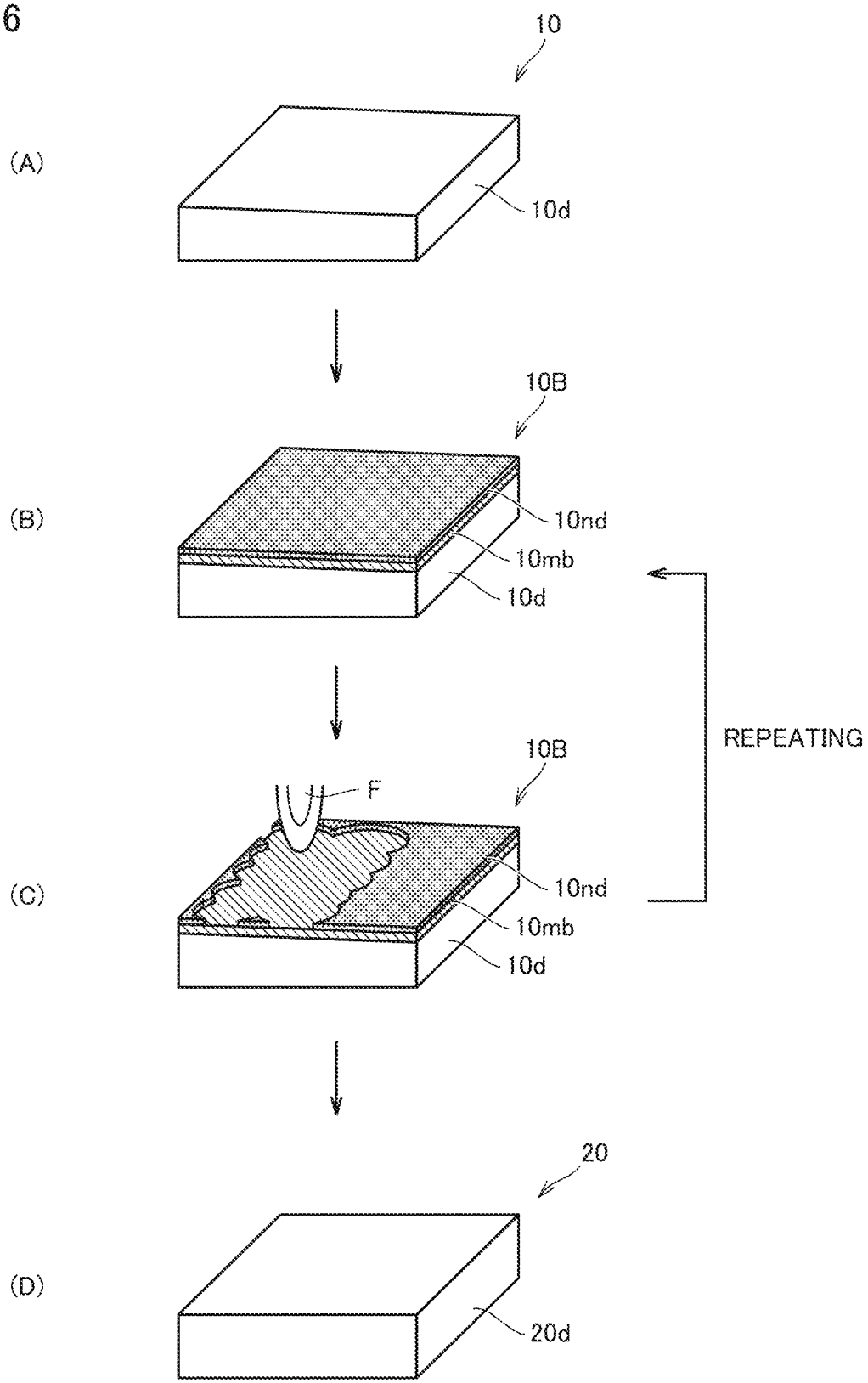
FIG. 6 is a schematic three-dimensional view showing an example of a method for producing a body obtained by processing a solid carbon-containing material according to one aspect of the present disclosure.
Figure 7:
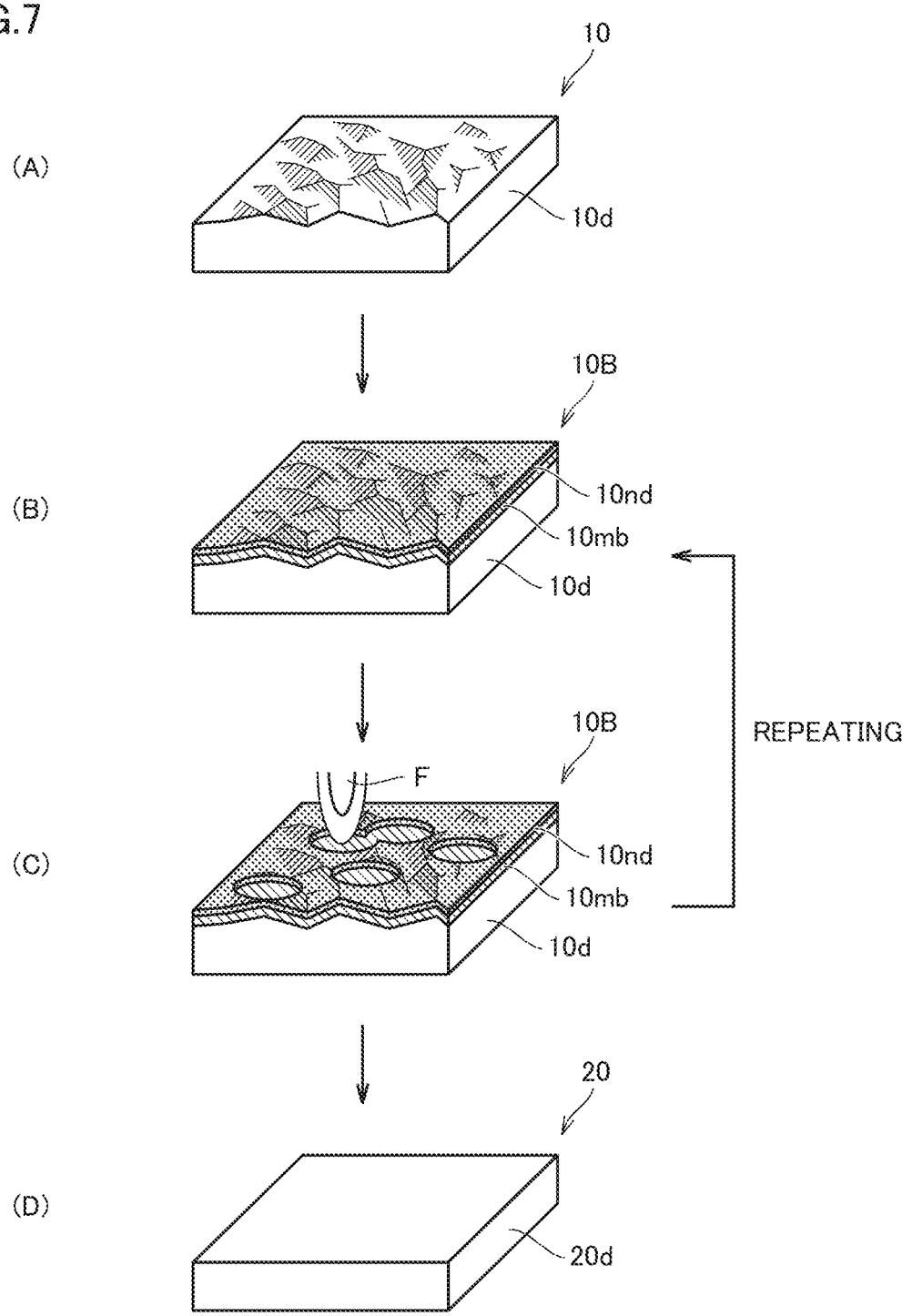
FIG. 7 is a schematic three-dimensional view showing an example of a method for producing a body obtained by processing a solid carbon-containing material according to one aspect of the present disclosure.

Even in the example shown in FIG. 5, when the solid carbon-containing material is processed in changed shapes many times by a small-diameter plasma jet and the like, each single step is not steep, whereby one step is a smooth projection, and a shape having smoother undulation can be wholly formed as desired. In the example shown in FIG. 7, if many protrusion portions are processed in the solid carbon-containing material having large irregularities in the surface, and recessed portions are hardly processed, the irregularities are reduced by repeating the process, whereby a flat and smooth surface can also be formed. Instead of repeating the above process, the non-diamond carbon layer is simultaneously removed in an environment where the heat treatment can be performed to form the non-diamond carbon layer, whereby the sub-step of forming the non-diamond carbon and the sub-step of removing the non-diamond carbon can also be caused to simultaneously proceed.

As shown in FIG. 15(A), solid carbon-containing material 10B in which metal layer 10*mb* containing the readily carbon solid-soluble metal element is formed on a part of the surface is heat-treated, whereby non-diamond carbon 10*nd* is deposited on the surface of metal layer 10*mb*. However, as shown in FIGS. 16 and 17, in a portion where metal layer 10*mb* containing the readily carbon solid-soluble metal element is not formed, metal layer 10*mn* not containing the readily carbon solid-soluble metal element is formed in at least a portion in contact with metal layer 10*mb* containing the readily carbon solid-soluble metal element. Next, as shown in FIG. 15(B), non-diamond carbon 10*nd* layer deposited on the surface of metal layer 10*mb* of solid carbon-containing material 10B is removed by etching and the like to expose metal layer 10*mb* containing the readily carbon solid-soluble metal element. Next, as shown in FIG. 15(C), solid carbon-containing material 10B in which metal layer 10*mb* containing the readily carbon solid-soluble metal element is exposed in a part of the surface is further heat-treated, whereby non-diamond carbon 10*nd* is deposited on the surface of exposed metal layer 10*mb* containing the readily carbon solid-soluble metal element. Newly formed non-diamond carbon 10*nd* layer is further removed, and exposed metal layer 10*mb* containing the readily carbon solid-soluble metal element is further heat-treated to deposit non-diamond carbon 10*nd* on the surface of exposed metal layer 10*mb* containing the readily carbon solid-soluble metal element. In this manner, in a desired portion of the surface of solid carbon-containing material 10, by repeating the deposition and removal of non-diamond carbon 10*nd* using metal layer 10*mb* containing the readily carbon solid-soluble metal element, the surface can be processed in a desired shape.

Figure 8:
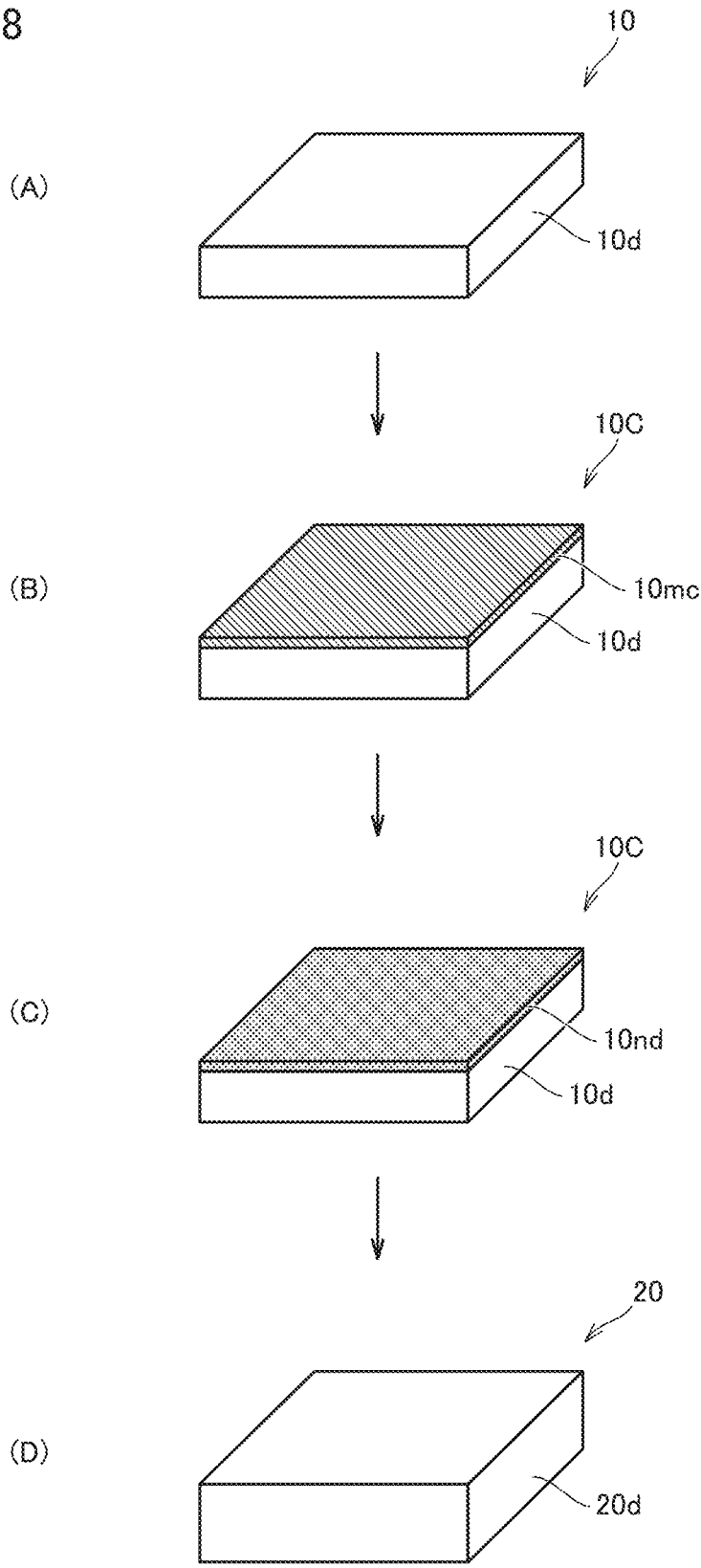
FIG. 8 is a schematic three-dimensional view showing an example of a method for producing a body obtained by processing a solid carbon-containing material according to one aspect of the present disclosure.

Here, with reference to FIGS. 16 and 17, if a portion other than metal layer 10*mb* partially formed and containing the readily carbon solid-soluble metal element is in an empty state, metal layer 10*mb* containing the readily carbon solid-soluble metal element expands or deforms in an area having an empty state, whereby accurate processing cannot be provided. When, in the portion other than metal layer 10*mb* partially formed and containing the readily carbon solid-soluble metal element, metal layer 10*mn* not containing the readily carbon solid-soluble metal element is formed in at least a contact portion thereof, a blocking effect provided by the metal layer can prevent metal layer 10*mb* containing the readily carbon solid-soluble metal element from expanding and deforming, so that accurate processing can be provided. In the method as shown in FIG. 8, it is possible to partially process metal layer 10*mb* containing the readily carbon solid-soluble metal element according to patterning without scanning a plasma jet or an ion beam, but it is difficult to apply undulation. Therefore, the undulation can also be applied in combination with scanning a plasma jet or an ion beam.

In the heat treatment of solid carbon-containing materials 10, 10B of embodiment 1B, the oxygen partial pressure in the atmosphere for heat-treating is preferably less than or equal to 0.133 Pa, more preferably less than or equal to 0.0133 Pa, and still more preferably less than or equal to 0.000133 Pa from the viewpoint of processing the solid carbon-containing material with high accuracy. A temperature for the heat treatment is preferably higher than or equal to 600° C., more preferably higher than or equal to 800° C., and still more preferably higher than or equal to 1000° C. from the viewpoint of processing the solid carbon-containing material in a short time.

Embodiment 1C

Figure 9:
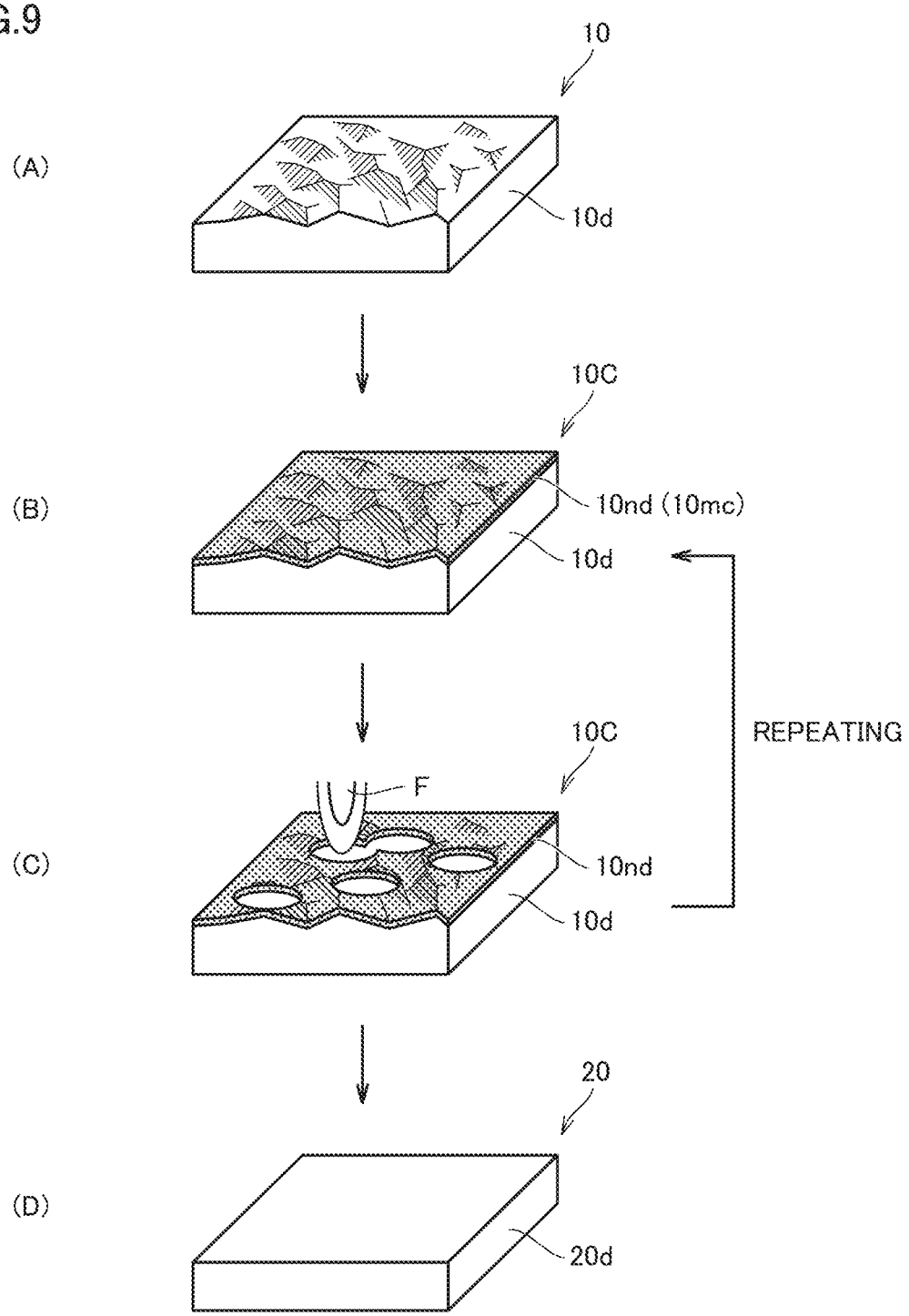
FIG. 9 is a schematic three-dimensional view showing an example of a method for producing a body obtained by processing a solid carbon-containing material according to one aspect of the present disclosure.
Figure 14:
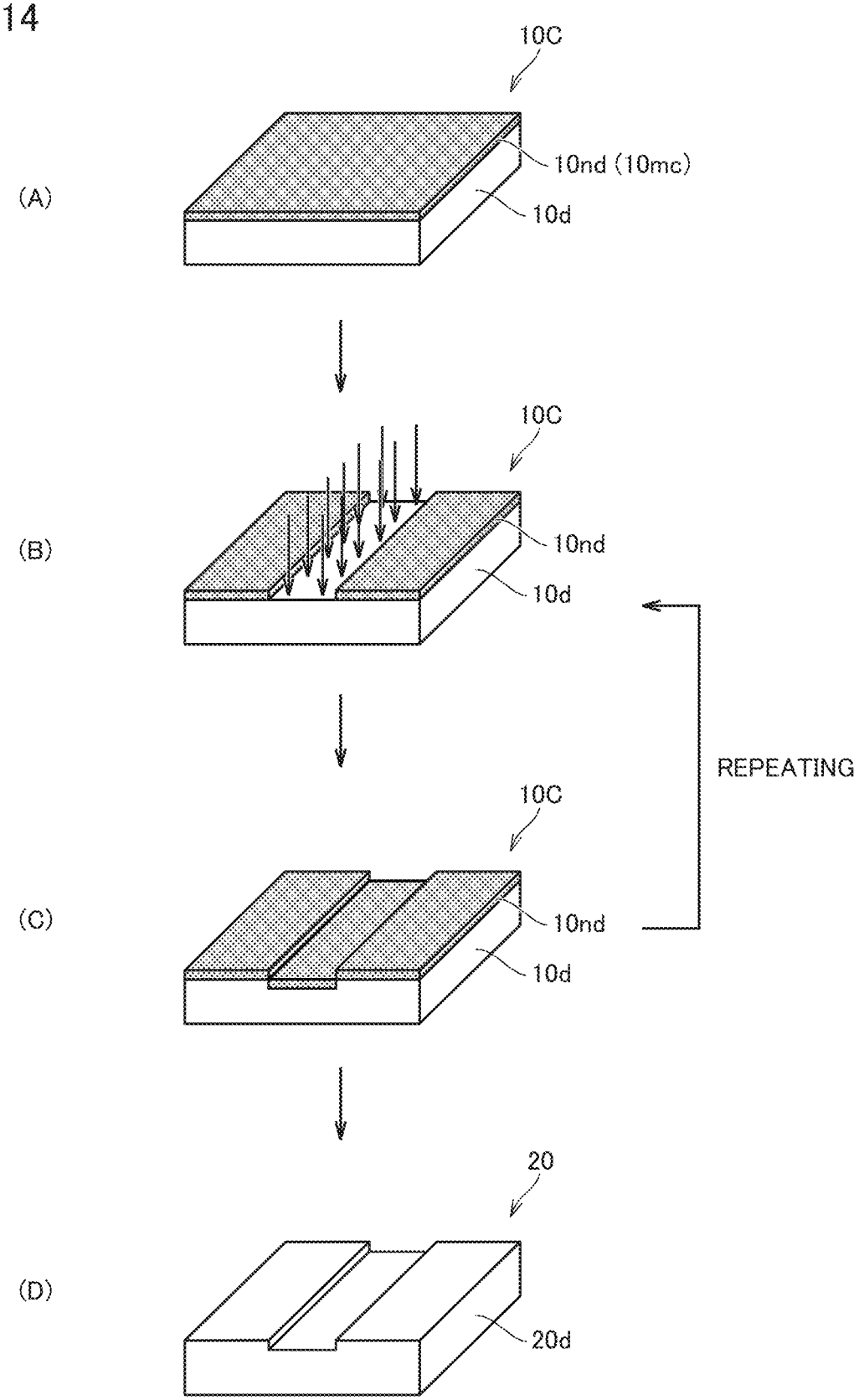
FIG. 14 is a schematic three-dimensional view showing an example of a method for producing a body obtained by processing a solid carbon-containing material according to one aspect of the present disclosure.
Figure 15:
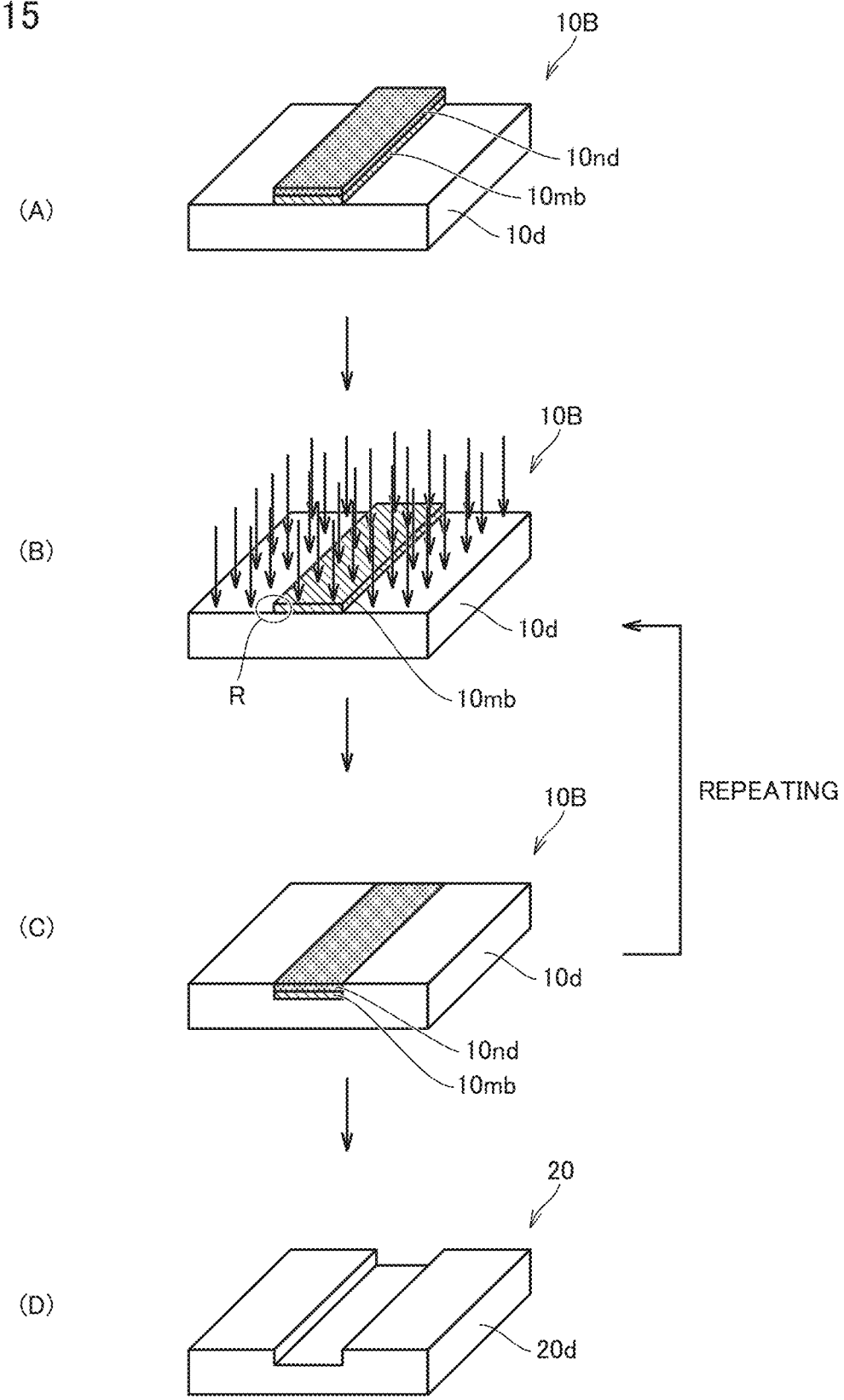
FIG. 15 is a schematic three-dimensional view showing an example of a method for producing a body obtained by processing a solid carbon-containing material according to one aspect of the present disclosure.

With reference to FIGS. 1, 8, 9, 14, and 18, in a more specific embodiment 1C, in step S20 for processing a solid carbon-containing material 10 having at least a surface composed of a material containing diamond carbon 10$d$, by the sub-step of forming a metal layer 10$mc$ containing at least one metal element (easily carbonizable metal element) selected from the group consisting of Ti, Zr, Hf, V, Nb, Ta, Cr, Mo, and W on at least a part of the surface of solid carbon-containing material 10, a solid carbon-containing material 10C is obtained, in which metal layer 10$mc$ containing the easily carbonizable metal element is formed on at least a part of the surface (FIGS. 8(B), 9(B), 14(A), and 18(A)). Here, FIGS. 8(B), 9(B), and 14(A) show a case where metal layer 10$mc$ containing the easily carbonizable metal element is formed on the entire surface of solid carbon-containing material 10. FIG. 18(A) shows a case where metal layer 10$mc$ containing the easily carbonizable metal element is formed on part of the surface of solid carbon-containing material 10.

By heat-treating diamond carbon 10$d$ on the surface of solid carbon-containing material 10C, diamond carbon 10$d$ in solid carbon-containing material 10 in contact with metal layer 10$mc$ containing the easily carbonizable metal element reacts with metal layer 10$mc$ to obtain a solid carbon-containing material 10C in which a metal carbide as non-diamond carbon 10$nd$ is formed on at least a part of the surface (FIGS. 8(C), 9(B), 14(A), and 18(B)).

By the sub-step of removing at least a part of non-diamond carbon 10$nd$ from solid carbon-containing material 10C (FIGS. 8(D), 9(C) and 9(D), 14(B) and 14(D), and 18(C) and 18(D)), a body obtained by processing a solid carbon-containing material 20 (FIGS. 8(D), 9(D), 14(D), and 18(D)) is obtained. In this manner, body obtained by processing a solid carbon-containing material 20 is obtained by smoothly processing the surface of solid carbon-containing material 10 (in, for example, a smooth shape or a shape having desired irregularities in a smooth surface) with high quality in a short time regardless of a plane orientation thereof. Here, FIGS. 8(D), 9(D), 14(D), and 18(C) and 18(D) show a case where non-diamond carbon 10$nd$ formed on the surface of solid carbon-containing material 10 is wholly removed. FIGS. 9(C) and 14(B) show a case where a part of non-diamond carbon 10$nd$ formed on the surface of solid carbon-containing material 10 is removed. The method for removing a part of non-diamond carbon 10$nd$ is not particularly limited, but from the viewpoint of improving processing accuracy, or from the viewpoint of producing a controlled flat surface (intended flat surface) or a controlled curved surface (intended curved surface), a processing method using a plasma jet or ion beam having a small diameter, a method using a mask having a small opening, and a mechanical removing method and the like are preferable.

Here, since a gas phase fluid containing a plasma and an ion supplied from a small diameter processes the solid carbon-containing material, the processing accuracy is higher as the diameter thereof is smaller, or the gas phase fluid is supplied from a closer position. It is effective to select processing which uses a gas phase fluid containing a plasma or an ion and has different processing speeds for a metal carbide and diamond carbon. Here, as one example, selecting a gas containing fluorine is effective in facilitating the processing of the metal carbide and slowing the processing of the diamond carbon. A step in the present embodiment is a method for selecting a gas phase fluid which is less likely to process the diamond carbon and is likely to process the metal carbide, and processing a portion where the diamond carbon is changed to the metal carbide, to process the diamond carbon.

In a mechanical removing method, different conditions are selected fora diamond carbon processing speed and a metal carbide processing speed. This can be achieved by selecting a material having a hardness between the hardnesses of the diamond and metal carbide, for example, appropriately selecting ceramics such as BN, $Si_3N_4$, SiC, and $Al_2O_3$.

Metal layer 10$mc$ is further formed on exposed diamond carbon 10$d$ of solid carbon-containing material 10C in which a part of non-diamond carbon 10$nd$ formed on the surface of solid carbon-containing material 10 shown in FIG. 14(B) is removed by etching and the like, to expose diamond carbon 10$_d$. Thereafter, by further heat-treating, diamond carbon 10$d$ in contact with newly formed metal layer 10$mc$ reacts with metal layer 10$mc$ as shown in FIG. 14(C), to form the metal carbide which is non-diamond carbon 10$nd$. Newly formed non-diamond carbon 10$nd$ layer is further removed as shown in FIGS. 14(B) and 14(D). In this manner, by repeating the formation and removal of non-diamond carbon 10$nd$ using metal layer 10$mc$ containing the easily carbonizable metal element in a desired portion of the surface of solid carbon-containing material 10, the surface can be processed in a desired shape.

In the example shown in FIG. 14, a stepped part is formed by processing the same portion, but a fine stepped part is provided by processing a portion different from the first portion and the second portion. However, a stepped part having not a single step but a three-dimensional shape having different several steps (having undulating contour lines) can also be processed. The processed body having a wholly smooth three-dimensional shape can be obtained. Even in the example shown in FIG. 8, when the solid carbon-containing material is processed in changed shapes many times by a small-diameter plasma jet and the like, each single step is not steep, whereby one step is a smooth projection, and the shape having smoother undulation can be wholly formed as desired. In the example shown in FIG. 9, if many protrusion portions are processed in the solid carbon-containing material having large irregularities in the surface, and recessed portions are hardly processed, the irregularities are reduced by repeating the process, whereby a flat and smooth surface can also be formed. Instead of repeating the above process, the metal carbide is also removed in an environment where a metal is formed and heat-treated, whereby the sub-step of forming and the sub-step of removing can also be caused to simultaneously proceed.

By heat-treating solid carbon-containing material 10C in which metal layer 10$mc$ containing the easily carbonizable metal element shown in FIG. 18(A) is formed on a part of the surface, diamond carbon 10$d$ in solid carbon-containing material 10 in contact with metal layer 10$mc$ reacts with metal layer 10$mc$, to form the metal carbide which is non-diamond carbon 10$nd$ on a part of the surface as shown in FIG. 18(B). Next, as shown in FIGS. 18(C) and 18(D), non-diamond carbon 10*nd* layer formed on a part of the surface is removed by etching and the like. In this manner, the formation of metal layer 10*mc* containing the easily carbonizable metal element, and the formation and removal of non-diamond carbon 10*nd* using the heat treatment are repeated in a desired portion of the surface of solid carbon-containing material 10, whereby the surface can be processed in a desired shape.

In the heat treatment of solid carbon-containing materials 10, 10C of embodiment 1C, the oxygen partial pressure in the atmosphere for heat-treating is preferably less than or equal to 0.133 Pa, more preferably less than or equal to 0.0133 Pa, and still more preferably less than or equal to 0.000133 Pa from the viewpoint of processing the solid carbon-containing material with high accuracy. A temperature for the heat treatment is preferably higher than or equal to 300° C., more preferably higher than or equal to 600° C., and still more preferably higher than or equal to 800° C. from the viewpoint of processing the solid carbon-containing material in a short time.

Embodiment 2: Body Obtained by Processing Solid Carbon-Containing Material

With reference to FIGS. 22 and 24, a body obtained by processing a solid carbon-containing material 20 according to another embodiment of the present disclosure is a body obtained by processing a solid carbon-containing material, including a processed surface, at least a part of the processed surface being composed of solid carbon, wherein: the processed surface of the body obtained by processing a solid carbon-containing material has a smooth shape having a maximum height of less than or equal to 20 µm of small irregularities formed in the processed surface, or a shape having irregularities formed by a smooth surface in the processed surface and having a minimum height of greater than or equal to 30 µm; and the processed surface has a size of greater than or equal to 1 mm square, and a density of polishing damage points in the processed surface is less than or equal to 10 points/mm². Here, as shown in FIG. 22, small irregularities formed in a smooth processed surface 20*ps* refers to small irregularities which are unintentionally formed by the method for producing the body obtained by processing a solid carbon-containing material and have a maximum height of less than or equal to 20 µm. The maximum height of the small irregularities refers to a distance between a base plane 20*bp* being parallel to a least square plane 20*lsp* of processed surface 20*ps* and passing through a vertex of a maximum small recessed part of processed surface 20*ps* and a vertex of a maximum small protrusion part of the processed surface. Also, as shown in FIG. 24, irregularities formed by a smooth surface in processed surface 20*ps* refer to irregularities which are intentionally formed by the method for producing a body obtained by processing a solid carbon-containing material and have a minimum height of greater than or equal to 30 µm.

The minimum height of the irregularities refers to a distance between base plane 20*bp* being parallel to least square plane 20*lsp* of processed surface 20*ps* and passing through the vertex of the minimum recessed part of processed surface 20*ps* and the vertex of the minimum protrusion part of the processed surface. The smooth surface in which the irregularities are formed includes a smooth shape having the maximum height of less than or equal to 20 µm of the small irregularities. The body obtained by processing a solid carbon-containing material of the present embodiment has a smooth processed surface (for example, a smooth shape or a shape having desired irregularities in a smooth surface) having high crystal quality regardless of a plane orientation thereof.

From the above viewpoints, when processed surface 20*ps* of body obtained by processing a solid carbon-containing material 20 has a smooth shape, the maximum height of the small irregularities formed in smooth processed surface 20*ps* is preferably less than or equal to 20 µm, more preferably less than or equal to 10 µm, still more preferably less than or equal to 1 µm, and particularly preferably less than or equal to 0.1 µm. When processed surface 20*ps* of body obtained by processing a solid carbon-containing material 20 has irregularities formed by a smooth surface, the minimum height of the irregularities of processed surface 20*ps* is preferably greater than or equal to 30 µm, more preferably greater than or equal to 50 µm, and still more preferably greater than or equal to 100 µm. In the processed surface, the maximum height of the irregularities of a smooth portion can be set to be less than or equal to 0.1 µm, and the minimum height of the irregularities of the portion having smooth irregularities can also be set to be greater than or equal to 100 µm.

The maximum height of the small irregularities formed in smooth processed surface 20*ps* and the minimum height of the irregularities formed by a smooth surface in processed surface 20*ps* can be measured by a laser displacement meter (for example, a surface shape measuring system Dyvoce-3000 manufactured by Kohzu Precision Co., Ltd. or its equivalent). However, since the measurement accuracy of the laser displacement meter is about 1 µm, a scanning white light interferometer (for example, Zygo NewView 200 manufactured by Canon Inc. or its equivalent) is suitably used for measuring the height of small irregularities of less than 1 µm. The scanning white light interferometer causes difficult measurement of the height of the small irregularities in a wide area, and makes measurements in a plurality of narrow areas. For example, with reference to FIG. 23, the maximum height of the small irregularities by the scanning white light interferometer is taken as a maximum height measured and obtained in five ranges $R_1$, $R_2$, $R_3$, $R_4$, $R_5$ of 0.4-mm square centered on a centroid point $P_1$ of processed surface 20*ps* to be measured and four centroid points $P_2$, $P_3$, $P_4$, $P_5$ of four areas divided by two straight lines $L_1$ and $L_2$ orthogonal to each other at centroid point $P_1$.

The density of polishing damage points in the surface appears as polycrystalline particles (particles stacked in mismatch) of greater than or equal to 1 µm which are confirmed by epitaxially growing diamond by 5 µm on the surface of the processed body. By counting this, the polishing damage density can be evaluated. Diamond may be typically formed at a methane concentration of 3%, a pressure of $1.33 \times 10^4$ Pa, a microwave power of greater than or equal to 3 kW, and a substrate temperature of 950° C. A condition in which single crystal diamond can be formed is preferable. These are confirmed on a single crystal diamond substrate. On a polycrystalline diamond substrate having a particle diameter of greater than or equal to 50 µm, polycrystalline particles of greater than or equal to 1 µm and less than 10 µm confirmed by crystal-growing diamond by 5 µm are counted, whereby the density of polishing damage can be evaluated. In the growth condition of the diamond in this case, typically, the diamond is preferably formed at a methane concentration of 3%, a pressure of $1.33 \times 10^4$ Pa, a microwave power of greater than or equal to 6 kW, and a substrate temperature of 1000° C. A condition for forming polycrystalline diamond having less graphite in Raman spectroscopic analysis (condition in which G band is ¹/₁₀₀ of the peak of the diamond) is preferable. The polycrystalline diamond having a particle diameter of less than 50 μm or the other body obtained by processing a solid carbon-containing material can be evaluated by the density of polishing scratches exceeding 1 mm and observed in the surface with a differential interference microscope. In that case, 1 scratch/mm² may be converted as 1 piece/mm².

In body obtained by processing a solid carbon-containing material 20 of the present embodiment, the density of metal atoms in the surface may be greater than or equal to 1 ppb, and may be greater than or equal to 50 ppb. Even in such a body obtained by processing a solid carbon-containing material 20, the surface is smooth (has, for example, a smooth shape or a shape having desired irregularities in a smooth surface), and has high crystal quality. In the method for producing a body obtained by processing a solid carbon-containing material, when a metal layer containing one metal element selected from the group consisting of Fe, Co, Ni, Rh, Pd, Pt, Ir, and Mn as a readily carbon solid-soluble metal element, or a metal layer containing at least one metal element selected from the group consisting of Ti, Zr, Hf, V, Nb, Ta, Cr, Mo, and W as an easily carbonizable metal element is used for the formation of non-diamond carbon, atoms of these metal elements are taken into the surface of the body obtained by processing a solid carbon-containing material, so that the density of the metal atoms in the surface may be greater than or equal to 1 ppb.

With reference to FIG. 22, in body obtained by processing a solid carbon-containing material 20 of the present embodiment, the surface may have a periodic irregularities curved surface. Such a body obtained by processing a solid carbon-containing material 20 has a smooth surface regardless of a plane orientation thereof.

In the method for producing a body obtained by processing a solid carbon-containing material of embodiment 1, even when, as a method for removing at least a part of non-diamond carbon 10nd, a method for treating non-diamond carbon 10nd with a gas phase fluid of higher than or equal to 500° C. containing a gas containing at least one selected from the group consisting of an $O_2$ molecule, a $H_2$ molecule, and a $H_2O$ molecule (FIG. 19A), a method for treating non-diamond carbon 10nd in a plasma containing at least one selected from the group consisting of an O atom, a H atom, a He atom, and an Ar atom (FIG. 19A), a method for treating non-diamond carbon 10nd with an ion beam containing at least one selected from the group consisting of an O ion, a H ion, an OH ion, a He ion, and an Ar ion (FIG. 20A), or a method for removing non-diamond carbon 10nd according to at least one of mechanical and physical treatments (FIG. 21) is used, body obtained by processing a solid carbon-containing material 20 having a periodic irregularities curved surface can be formed.

With reference to FIG. 22, in body obtained by processing a solid carbon-containing material 20 of the present embodiment, processed surface 20ps may include a small recessed part bowing inward, and a small protrusion part bowing outward, and a total area of the small recessed part may be greater than or equal to 60% of a total area of the surface when processed surface 20ps is viewed from a direction perpendicular to least-square plane 201sp thereof. In body obtained by processing a solid carbon-containing material 20, processed surface 20ps has a smooth surface regardless of a plane orientation thereof. In the method for producing a body obtained by processing a solid carbon-containing material of embodiment 1, even when, as a method for removing at least a part of non-diamond carbon 10nd, a method for treating non-diamond carbon 10nd with a gas phase fluid containing a gas containing at least one selected from the group consisting of an $O_2$ molecule, a $H_2$ molecule, and a $H_2O$ molecule, and having a temperature higher than room temperature (for example, 25° C.) (FIG. 19A), a method for treating non-diamond carbon 10nd in a plasma containing at least one selected from the group consisting of an O atom, a H atom, a He atom, and an Ar atom (FIG. 19A), a method for treating non-diamond carbon 10nd with an ion beam containing at least one selected from the group consisting of an O ion, a H ion, an OH ion, a He ion, and an Ar ion (FIG. 20A), or a method for removing non-diamond carbon 10nd according to at least one of mechanical and physical treatments (FIG. 21) is used, body obtained by processing a solid carbon-containing material 20 can be formed, in which processed surface 20ps includes a small recessed part bowing inward, and a small protrusion part bowing outward, and a total area of the small recessed part is greater than or equal to 60% of a total area of the surface when processed surface 20ps is viewed from a direction perpendicular to least-square plane 201sp thereof.

In body obtained by processing a solid carbon-containing material 20 of the present embodiment, the solid carbon can contain at least one of single crystal diamond and polycrystalline diamond. Such a body obtained by processing a solid carbon-containing material 20 also has a surface having a smooth shape or a desired shape regardless of a surface orientation thereof. Such a body obtained by processing a solid carbon-containing material 20 is obtained by processing solid carbon-containing material 10 containing at least one of single crystal diamond and polycrystalline diamond (diamond carbon 10d) according to the method for producing a body obtained by processing a solid carbon-containing material of embodiment 1.

EXAMPLES

Example 1

As a solid carbon-containing material, single crystal diamond (hereinafter also referred to as high-pressure synthetic diamond or gas phase synthetic diamond) of a high-pressure synthesis method or a gas phase synthesis method (specifically, CVD (chemical vapor deposition) method) was cut by a laser to prepare samples of Examples I-1 to I-9 each having a size of 4 mm×4 mm and an average thickness shown in Table 1. All the samples were mechanically polished on one side with a normal grinder, and the samples of Examples I-3 to I-5 were further polished on the other side to prepare relatively flat double-side polished substrates. In the samples of Examples I-1 and I-2, the remaining one side was a laser slice plane, and in the samples of Examples I-6 to I-9, the remaining one side was left irregularities in the vapor-grown surface.

Information on the heights of the back and front surfaces of all the samples were evaluated with a laser displacement meter, and converted into thickness information, to obtain surface irregularities and parallelism data. Here, for all the samples, the machine-polished surface is referred to as a back surface, and the other surface is referred to as a front surface.

However, since the accuracy of measuring the heights of the front and back surfaces with the laser displacement meter was about 1 μm, a scanning white light interferometer was used to measure a height of less than 1 μm. The scanning white light interferometer caused difficult measurement of the height in a wide area, and made measurements in a plurality of narrow areas. For example, with reference to FIG. 23, a maximum height by the scanning white light interferometer was taken as a maximum height measured and obtained in five ranges $R_1$, $R_2$, $R_3$, $R_4$, $R_5$ of 0.4-mm square centered on a centroid point $P_1$ of a processed surface 20ps to be measured and four centroid points $P_2$, $P_3$, $P_4$, $P_5$ of four areas divided by two straight lines $L_1$ and $L_2$ orthogonal to each other at centroid point $P_1$.

For the processing of the solid carbon-containing material, samples with and without vapor-deposition of a 0.5 μm thick metal layer composed of a readily carbon solid-soluble metal element shown in Table 1 on the surface of the solid carbon-containing material were prepared, and placed in a heat treatment chamber. First, the inside of the heat treatment chamber was evacuated to less than $1.33 \times 10^{-4}$ Pa, and then filled with Ar gas, to perform heat treatments at pressures, oxygen partial pressures, and temperatures (temperatures of higher than or equal to 600° C.) shown in Table 1, thereby forming non-diamond carbon layers on the surface of diamond carbon or the surface of the metal layer.

In Table 1, an average thickness is a simple arithmetic average of values obtained by measuring thicknesses at five points on a substrate with a micrometer, and is used as an index of the thickness of the substrate. The five points are within a 0.25 mm area from the center of the substrate, and within a 0.5 mm area from the left, right, front, and back edges of the substrate. The maximum height of small irregularities is a distance between a base plane being parallel to the least square plane of the processed surface and passing through a vertex of a maximum small recessed part of the processed surface and a vertex of a maximum small protrusion part of the processed surface. An angle formed by the least square plane of the front surface and the least square plane base surface of the back surface is parallelism.

The solid carbon-containing material was processed by removing the non-diamond carbon layer formed on the surface. As a processing method for removing the non-diamond carbon layer, there was used a "plasma gas phase fluid" method for removing the non-diamond carbon layer by scanning a gas phase fluid containing a plasma containing O and H atoms over the solid carbon-containing material, or an "ion beam" method for removing the non-diamond carbon layer by scanning an ion beam containing an O ion over the solid carbon-containing material. That is, by repeating the formation of non-diamond and the removal of the non-diamond, one close to desired specifications was formed.

A method for scanning a plasma gas phase fluid or an ion beam uses the irregularities information of the substrate to scan the "plasma gas phase fluid" or the "ion beam" so as to inject or emit the plasma gas phase fluid or the ion beam in a state where a stay time is lengthened in the protrusion part of the solid carbon-containing material and a stay time is shortened in the recessed part of the solid carbon-containing material using the irregularities information of the substrate. As a result, in the solid carbon-containing material, the diamond carbon in the protrusion part was etched in a relatively large amount, and the diamond carbon in the recessed part was etched in a relatively small amount. Collectively, using the parallelism information, scanning was controlled so that a portion having a large substrate thickness was long, and a portion having a small substrate thickness was short. The portion having a large substrate thickness was etched in a relatively large amount, and the portion having a small substrate thickness was etched in a relatively small amount to allow an improvement in the parallelism and a reduction in the maximum height of the irregularities. The evaluations of the parallelism and irregularities of the treated substrate were measured by the laser displacement meter or the scanning white light interferometer after removing the metal and graphite of the substrate by treatment with an acid or a hydrogen plasma. As a processing speed, a numerical value of a simple height etching processing speed was calculated. This is the value of a processing thickness (reduced thickness) per unit time when the same portion is continuously processed without scanning a plasma, an ion flow current, or a beam. The value is a numerical value of the height of the surface reduced by etching. In each example, the processing speed was greater than or equal to 34 μm/h, which allowed processing in a short time.

The density of polishing damage points in the processed surface was obtained by observing a surface on which high-purity diamond hydrogen-terminated on the surface of the substrate was formed by epitaxially growing 5 μm of undoped diamond at a methane concentration of about 3% on a body obtained by processing a solid carbon-containing material by a gas phase synthesis method, and counting polycrystalline grains of greater than or equal to 1 μm directed in a different orientation from that of a seed substrate. These results were summarized in Table 1.

TABLE 1

| Example I | | Example I-1 | Example I-2 | Example I-3 | Example I-4 | Example I-5 |
|---|---|---|---|---|---|---|
| Solid carbon-containing material | Type | High-pressure synthetic diamond | High-pressure synthetic diamond | High-pressure synthetic diamond | High-pressure synthetic diamond | High-pressure synthetic diamond |
| | Size (mm × mm) | 4 × 4 | 4 × 4 | 4 × 4 | 4 × 4 | 4 × 4 |
| | Surface condition [front surface/back surface] | Laser slice/polishing | Laser slice/polishing | Polishing/polishing | Polishing/polishing | Polishing/polishing |
| | Average thickness (μm) | 820 | 710 | 890 | 800 | 590 |
| | Maximum height of irregularities (μm) | 220 | 240 | 1 | 0.5 | 0.3 |
| | Parallelism (°) | 2.5 | 2.0 | 0.4 | 0.3 | 0.2 |
| | Density of polishing damage points in front surface (points/mm$^2$) | 0 | 0 | 80 | 20 | 120 |
| Processing method | Non-diamond layer Formation | | | | | |
| | Type of metal layer | Ni | Fe | Co | NiFe alloy | None |
| | Heat treatment atmosphere gas | Ar | Ar | Ar | Ar | Ar |
| | Heat treatment pressure (kPa) | 30 | 50 | 1 | 1 | 1 |
| | Heat treatment oxygen partial pressure (×10$^{-4}$ Pa) | <1.33 | <1.33 | <1.33 | <1.33 | <1.33 |
| | Heat treatment temperature (° C.) | 900 | 1000 | 950 | 950 | 1200 |

TABLE 1-continued

| | | Example I-1 | Example I-2 | Example I-3 | Example I-4 | Example I-5 |
|---|---|---|---|---|---|---|
| Non-diamond layer Removal | Processing method | Plasma gas phase fluid | Plasma gas phase fluid | Ion beam | Ion beam | Ion beam |
| | Processing gas | $Ar + CO_2$ | $Ar + H_2O$ | $O_2$ | $Ar + H_2$ | $Ar + CO_2$ |
| | Flow current/beam diameter (μm) | 700 | 700 | 1000 | 1000 | 1000 |
| Processing speed (μm/h) | | 180 | 210 | 80 | 110 | 35 |
| Body obtained by processing solid carbon-containing material | Average thickness (μm) | 690 | 580 | 800 | 710 | 520 |
| | Maximum height of small irregularities (μm) | 3 | 3 | 0.2 | 0.1 | 0.1 |
| | Parallelism (°) | 0.1 | 0.1 | 0.07 | 0.08 | 0.05 |
| | Density of polishing damage points in front surface (points/mm²) | 0 | 0 | 0 | 0 | 0 |

| Example I | | Example I-6 | Example I-7 | Example I-8 | Example I-9 |
|---|---|---|---|---|---|
| Solid carbon-containing material | Type | Gas phase synthesis diamond | Gas phase synthesis diamond | Gas phase synthesis diamond | Gas phase synthesis diamond |
| | Size (mm × mm) | 4 × 4 | 4 × 4 | 4 × 4 | 4 × 4 |
| | Surface condition [front surface/back surface] | Growth surface/ polishing | Growth surface/ polishing | Growth surface/ polishing | Growth surface/ polishing |
| | Average thickness (μm) | 1220 | 1450 | 1320 | 1090 |
| | Maximum height of irregularities (μm) | 110 | 190 | 160 | 150 |
| | Parallelism (°) | 1.2 | 2.0 | 1.5 | 1.0 |
| | Density of polishing damage points in front surface (points/mm²) | 0 | 0 | 0 | 0 |
| Processing method | Non-diamond layer Formation | | | | |
| | Type of metal layer | Ni | Fe | Co | None |
| | Heat treatment atmosphere gas | Ar | Ar | Ar | Ar |
| | Heat treatment pressure (kPa) | 1 | 1 | 1 | 1 |
| | Heat treatment oxygen partial pressure (×10⁻⁴ Pa) | <1.33 | <1.33 | <1.33 | <1.33 |
| | Heat treatment temperature (°C) | 900 | 1000 | 950 | 1200 |
| | Non-diamond layer Removal Processing method | Plasma gas phase fluid | Plasma gas phase fluid | Plasma gas phase fluid | Plasma gas phase fluid |
| | Processing gas | $Ar + CO_2$ | $Ar + CO_2$ | $Ar + CO_2$ | $Ar + CO_2$ |
| | Flow current/beam diameter (μm) | 700 | 700 | 700 | 700 |
| Processing speed (μm/h) | | 170 | 160 | 90 | 40 |
| Body obtained by processing solid carbon-containing material | Average thickness (μm) | 1080 | 1150 | 1040 | 980 |
| | Maximum height of small irregularities (μm) | 2 | 2 | 1 | 3 |
| | Parallelism (°) | 0.08 | 0.04 | 0.05 | 0.06 |
| | Density of polishing damage points in front surface (points/mm²) | 0 | 0 | 0 | 0 |

With reference to Table 1, in the all samples, the maximum height, parallelism, and density of polishing damage points of small irregularities after processing were less than those of polishing damage points of initial irregularities. Thus, a body obtained by processing a solid carbon-containing material, having a smoother surface and high quality was obtained.

Example II

As a solid carbon-containing material, single crystal diamond (hereinafter also referred to as high-pressure synthetic diamond or gas phase synthetic diamond) of a high-pressure synthesis method or a gas phase synthesis method (specifically, CVD (chemical vapor deposition) method) was cut by a laser to prepare samples of Examples II-1 to II-4 each having a size of 4 mm×4 mm and an average thickness shown in Table 2. The samples of Example II-1 and Example II-2 were mechanically polished on front and back surfaces with a normal polishing machine, to prepare relatively flat double-side polished substrates. In the samples of Example II-3 and Example II-4, one side was a surface obtained by epitaxial growth after ion implantation into a laser slice plane seed substrate, and electrochemically etching a graphite layer to separate an epitaxial growth layer from the seed substrate. The remaining one side was left irregularities in the vapor-grown surface. Information on the heights of the back and front surfaces of all the samples were evaluated with a laser roughness meter or a scanning white light interferometer, and converted into thickness information, to obtain surface irregularities before processing, and small irregularities and parallelism data after processing. Here, for all the samples, the machine-polished surface is referred to as a back surface, and the other surface is referred to as a front surface.

For the processing of the solid carbon-containing material, a sample was prepared, in which a 0.5 μm thick metal layer composed of an easily carbonizable metal element shown in Table 2 was vapor-deposited on the surface of the solid carbon-containing material, and placed in a heat treatment chamber. First, the inside of the heat treatment chamber was evacuated to less than or equal to $1.33 \times 10^{-4}$ Pa, and then filled with Ar gas, to set to the pressure to 0.1 atmosphere. Thereafter, heat treatments were performed at pressures, oxygen partial pressures, and temperatures (temperatures of higher than or equal to 300° C.) shown in Table 2, thereby forming non-diamond carbon layers on the surface of diamond carbon or the surface of the metal layer.

The solid carbon-containing material was processed by removing the non-diamond carbon layer formed on the surface. As a treatment method for removing the non-diamond carbon layer, the same "ion beam" method as that in Example I was used.

A method for scanning a plasma gas phase fluid or an ion beam was the same as that in Example I, and a portion having a large substrate thickness could be etched in a relatively large amount, and a portion having a small substrate thickness could be etched in a relatively small amount to allow an improvement in the parallelism and a reduction in the maximum height of the irregularities. In each example, the processing speed was greater than or equal to 34 μm/h, which allowed processing in a short time. The parallelism and irregularities of the treated substrate were evaluated in the same manner as in Example I. The density of polishing damage points in the surface was measured and calculated in the same manner as in Example I. These results were summarized in Table 2.

Example III

Gas phase synthetic diamond was prepared as a solid carbon-containing material, and the same experiment as that in Example I was performed by changing a metal type, a processing method, and a processing gas for forming non-diamond. Rh, Pd, Pt, Ir, or Mn was used as a readily carbon solid-soluble metal element. The results were summarized in Table 3. "In flow current" in "treatment method" of "non-diamond layer removal" in Table 3 means not that, as a flow current or a beam, the staying time in a high surface portion is long and the staying time in a low surface portion is short to remove a part, but only that a treatment is performed in the atmosphere of the gas. At this time, the entire solid carbon-containing material was uniformly processed, and flatness and parallelism were not largely improved as compared with the case where a plasma flow current or an ion beam was used. The processing speed was also slightly slower, and it was examined as Comparative Example. In "process gas" of "non-diamond layer removal" in Table 3, "Ar+$H_2O$" means use of Ar gas containing $H_2O$ obtained by bubbling water of 60° C. with Ar at atmospheric pressure. "He+$H_2O$" means use of He gas containing $H_2O$ obtained by

TABLE 2

| Example II | | Example II-1 | Example II-2 | Example II-3 | Example II-4 |
|---|---|---|---|---|---|
| Solid carbon Contained material | Type | High-pressure synthetic diamond | High-pressure synthetic diamond | High-pressure synthetic diamond | High-pressure synthetic diamond |
| | Size (mm × mm) | 4 × 4 | 4 × 4 | 4 × 4 | 4 × 4 |
| | Surface condition [front surface/back surface] | Polishing/polishing | Polishing/polishing | Growth surface/separation surface | Growth surface/separation surface |
| | Average thickness (μm) | 670 | 480 | 150 | 240 |
| | Maximum height of irregularities (μm) | 0.3 | 0.2 | 30 | 40 |
| | Parallelism (°) | 0.3 | 0.15 | 0.1 | 0.3 |
| | Density of polishing damage points in front surface (points/mm²) | 40 | 30 | 0 | 0 |
| Processing method | Non-diamond layer formation | Type of metal layer | Ti | Zr | Ti | Hf |
| | | Heat treatment atmosphere gas | Ar | Ar | Ar | Ar |
| | | Heat treatment pressure (MPa) | 0.1 | 0.1 | 0.1 | 0.1 |
| | | Heat treatment oxygen partial pressure (Pa) | <0.133 | <0.133 | <0.133 | <0.133 |
| | | Heat treatment temperature (° C.) | 300 | 500 | 400 | 600 |
| | Non-diamond layer removal | Processing method | Ion beam | Ion beam | Ion beam | Ion beam |
| | | Processing gas | Ar | Ar | Ar | Ar |
| | | Flow current/beam diameter (μm) | 700 | 700 | 700 | 700 |
| Processing speed (μm/h) | | 70 | 65 | 75 | 65 |
| Body obtained by processing solid carbon-containing material | Average thickness (μm) | 630 | 450 | 110 | 190 |
| | Maximum height of small irregularities (μm) | 0.2 | 0.1 | 1 | 1 |
| | Parallelism (°) | 0.03 | 0.02 | 0.01 | 0.02 |
| | Density of polishing damage points in front surface (points/mm²) | 0 | 0 | 0 | 0 |

With reference to Table 2, in the all samples, the maximum height, parallelism, and density of polishing damage points of irregularities after processing were less than those of initial irregularities. Thus, a body obtained by processing a solid carbon-containing material, having a smoother surface and high quality was obtained.

bubbling water of 60° C. with He at atmospheric pressure. With reference to Table 3, those obtained by forming the non-diamond carbon using the readily carbon solid-soluble metal element as compared with those heat-treated in gas, and removing a part of the non-diamond carbon required for planarization and parallelism using a plasma flow current or an ion beam could process and flatten the surface state of gas phase synthetic diamond. In each example, the processing speed was greater than or equal to 34 μm/h, which allowed processing in a short time.

TABLE 3

| Example III | | Example III-1 | Example III-2 | Example III-3 | Example III-4 | Example III-5 | Example III-6 |
|---|---|---|---|---|---|---|---|
| Solid carbon-containing material | Type | Gas phase synthesis diamond | Gas phase synthesis diamond | Gas phase synthesis diamond | Gas phase synthesis diamond | Gas phase synthesis diamond | Gas phase synthesis diamond |
| | Size (mm × mm) | 4 × 4 | 4 × 4 | 4 × 4 | 4 × 4 | 4 × 4 | 4 × 4 |
| | Surface condition [front surface/back surface] | Growth surface/ polishing | Growth surface/ polishing | Growth surface/ polishing | Growth surface/ polishing | Growth surface/ polishing | Growth surface/ polishing |
| | Average thickness (μm) | 1070 | 1110 | 1050 | 1020 | 1100 | 1090 |
| | Maximum height of irregularities (μm) | 130 | 140 | 120 | 150 | 110 | 120 |
| | Parallelism (°) | 2.5 | 2.7 | 3.0 | 2.4 | 2.8 | 2.4 |
| | Density of polishing damage points in front surface (points/mm$^2$) | 0 | 0 | 0 | 0 | 0 | 0 |
| Processing method — Non-diamond layer formation | Type of metal layer | Ru | Pd | Pt | Ir | Mn | None |
| | Heat treatment atmosphere gas | Ar | Ar | Ar | Ar | Ar | Ar |
| | Heat treatment pressure (kPa) | 1 | 1 | 1 | 1 | 1 | 1 |
| | Heat treatment oxygen partial pressure (×10$^{-4}$ Pa) | <1.33 | <1.33 | <1.33 | <1.33 | <1.33 | <1.33 |
| | Heat treatment temperature (° C.) | 1300 | 1300 | 1300 | 1300 | 1150 | 1300 |
| Non-diamond layer Removal | Processing method | Plasma gas phase fluid | Plasma gas phase fluid | Plasma gas phase fluid | Plasma gas phase fluid | Plasma gas phase fluid | In gas (total removal) |
| | Processing gas | Ar + H$_2$O | Ar + H$_2$O | He + H$_2$O | He + H$_2$O | Ar + H$_2$O | Ar + H$_2$O |
| | Flow current/beam diameter (μm) | 700 | 700 | 700 | 700 | 700 | — |
| Processing speed (μm/h) | | 70 | 60 | 75 | 85 | 60 | 25 |
| Body obtained by processing solid carbon-containing material | Average thickness (μm) | 900 | 950 | 900 | 850 | 980 | 950 |
| | Maximum height of small irregularities (μm) | 4.5 | 4.5 | 3.5 | 4.0 | 5.0 | 100 |
| | Parallelism (°) | 0.2 | 0.2 | 0.16 | 0.18 | 0.25 | 2.4 |
| | Density of polishing damage points in front surface (points/mm$^2$) | 0 | 0 | 0 | 0 | 0 | 0 |

Example IV

Gas phase synthetic diamond was prepared as a solid carbon-containing material, and the same experiment as that in Example II was performed by changing a metal type, a treatment method, and a treatment gas for forming non-diamond. V, Nb, Ta, Cr, Mo, or W was used as an easily carbonizable metal element. The results were summarized in Table 4. With reference to Table 4, those obtained by forming the non-diamond carbon using the easily carbonizable metal element, and removing a part of the non-diamond carbon required for planarization and parallelism using a plasma flow current or an ion beam could process and flatten the surface state of gas phase synthetic diamond. In each example, the processing speed was greater than or equal to 34 μm/h, which allowed processing in a short time.

TABLE 4

| Example IV | | Example IV-1 | Example IV-2 | Example IV-3 | Example IV-4 | Example IV-5 | Example IV-6 |
|---|---|---|---|---|---|---|---|
| Solid carbon-containing material | Type | Gas phase synthesis diamond | Gas phase synthesis diamond | Gas phase synthesis diamond | Gas phase synthesis diamond | Gas phase synthesis diamond | Gas phase synthesis diamond |
| | Size (mm × mm) | 4 × 4 | 4 × 4 | 4 × 4 | 4 × 4 | 4 × 4 | 4 × 4 |
| | Surface condition [front surface/back surface] | Growth surface/ polishing | Growth surface/ polishing | Growth surface/ polishing | Growth surface/ polishing | Growth surface/ polishing | Growth surface/ polishing |
| | Average thickness (μm) | 980 | 1030 | 990 | 1000 | 1010 | 900 |
| | Maximum height of irregularities (μm) | 110 | 120 | 90 | 110 | 110 | 90 |
| | Parallelism (°) | 2.5 | 2.7 | 3.0 | 2.4 | 2.8 | 2.4 |
| | Density of polishing damage points in front surface (points/mm$^2$) | 0 | 0 | 0 | 0 | 0 | 0 |

TABLE 4-continued

| Example IV | | | Example IV-1 | Example IV-2 | Example IV-3 | Example IV-4 | Example IV-5 | Example IV-6 |
|---|---|---|---|---|---|---|---|---|
| Processing method | Non-diamond layer formation | Type of metal layer | V | Nb | Ta | Cr | Mo | W |
| | | Heat treatment atmosphere gas | Ar | Ar | Ar | Ar | Ar | Ar |
| | | Heat treatment pressure (kPa) | 1 | 1 | 1 | 1 | 1 | 1 |
| | | Heat treatment oxygen partial pressure ($\times 10^{-4}$ Pa) | <1.33 | <1.33 | <1.33 | <1.3.3 | <1.33 | <1.3.3 |
| | | Heat treatment temperature (° C.) | 800 | 800 | 800 | 800 | 800 | 800 |
| | Non-diamond layer removal | Processing method | Ion beam | Ion beam | Ion beam | Ion beam | Ion beam | Ion beam |
| | | Processing gas | Ar | Ar | Ar | Ar | Ar | Ar |
| | | Flow current/beam diameter (μm) | 700 | 700 | 700 | 700 | 700 | 700 |
| Processing speed (μm/h) | | | 50 | 55 | 65 | 65 | 50 | 60 |
| Body obtained by processing solid carbon-containing material | | Average thickness (μm) | 850 | 890 | 880 | 870 | 870 | 790 |
| | | Maximum height of small irregularities (μm) | 6.5 | 6.5 | 5.5 | 5.5 | 6.0 | 6.0 |
| | | Parallelism (°) | 0.35 | 0.36 | 0.26 | 0.26 | 0.28 | 0.28 |
| | | Density of polishing damage points in front surface (points/mm$^2$) | 0 | 0 | 0 | 0 | 0 | 0 |

<Additional Statement>

In the method for producing a body obtained by processing a solid carbon-containing material, the processed surface of the body obtained by processing a solid carbon-containing material preferably has a smooth surface shape having a maximum height of less than or equal to 20 μm of small irregularities formed in the processed surface, or a surface shape having irregularities formed by a smooth surface in the processed surface and having a minimum height of greater than or equal to 30 μm. Here, the small irregularities formed in the smooth processed surface refer to small irregularities unintentionally formed by the method for producing a body obtained by processing a solid carbon-containing material and having a maximum height of less than or equal to 20 μm. The maximum height of the small irregularities refers to a distance between a base plane being parallel to the least square plane of the processed surface and passing through a vertex of a maximum small recessed part of the processed surface and a vertex of a maximum small protrusion part of the processed surface. The irregularities formed by the smooth surface in the processed surface refer to irregularities intentionally formed by the method for producing a body obtained by processing a solid carbon-containing material and having a minimum height of greater than or equal to 30 μm. The minimum height of the irregularities refers to a distance between a base plane being parallel to the least square plane of the processed surface and passing through a vertex of a minimum recessed part of the processed surface and a vertex of a minimum protrusion part of the processed surface. The smooth surface in which the irregularities are formed includes a smooth shape having the maximum height of less than or equal to 20 μm of the small irregularities. Such a method for producing a body obtained by processing a solid carbon-containing material can more smoothly process the surface of the solid carbon-containing material (in, for example, a smooth shape or a shape having desired irregularities in a smooth surface) in a short time regardless of a plane orientation thereof.

It should be understood that the embodiment and examples disclosed herein are illustrative and non-restrictive in all respects. The scope of the present invention is defined by the claims, rather than the embodiments above, and is intended to include any modifications within the meaning and scope equivalent, to the claims.

REFERENCE SIGNS LIST 10, 10A, 10B, 10C: solid carbon-containing material, 10d, 20d: diamond carbon, 10i: inscribed circle of surface, 10mb, 10mc: metal layer, 10nd: non-diamond carbon, 20: Body obtained by processing solid carbon-containing material, 20bp: base plane, 20lsp: least square plane, 20ps: processed surface, 111: fluid ejection part, 121: beam radiation part, 122: mask, 122w: opening, 122wc: circumscribed circle of opening, 131: removal tool, B: ion beam, $D_B$: ion beam diameter, $D_C$: diameter of circumscribed circle of mask opening, $D_F$: diameter of gas phase fluid, Di: diameter of inscribed circle on surface of solid carbon-containing material, radius of inscribed circle on surface of solid carbon-containing material, F: gas phase fluid, S10: step of preparing solid carbon-containing material, S20: step of processing solid carbon-containing material, S21: sub-step of forming metal layer, S22: sub-step of forming non-diamond carbon, S23: sub-step of removing at least part of non-diamond carbon

The invention claimed is:

1. A method for producing a body obtained by processing a solid carbon-containing material, the method comprising:
    a step of preparing the solid carbon-containing material having at least a surface composed of solid carbon; and
    a step of processing the solid carbon-containing material,
    wherein the step of processing the solid carbon-containing material includes:
        a sub-step of forming non-diamond carbon by heat-treating the solid carbon in the surface of the solid carbon-containing material; and
        a sub-step of removing at least a part of the non-diamond carbon,
    wherein a method for removing at least a part of the non-diamond carbon is at least one of
    a method for treating the non-diamond carbon with a gas phase fluid containing a gas containing at least one selected from the group consisting of an oxygen molecule, a hydrogen molecule, and a water molecule, by spraying the gas phase fluid onto the surface of the solid carbon-containing material from a fluid spraying part, a method for treating the non-diamond carbon with a gas phase fluid containing a plasma containing at least one selected from the group consisting of an oxygen atom, a hydrogen atom, a helium atom, and an argon atom, by spraying the gas phase fluid onto the surface of the solid carbon-containing material from a fluid spraying part, and a method for treating the non-diamond carbon with an ion beam containing at least one selected from the group consisting of an oxygen ion, a hydrogen ion, a hydroxide ion, a helium ion, and an argon ion, by irradiating the surface of the solid carbon-containing material with the ion beam from a beam radiating part, wherein at least one of the gas phase fluid containing at least one of the gas and the plasma is scanned by moving the fluid spraying part relative to the solid carbon-containing material, and the ion beam is scanned by moving the beam radiating part relative to the solid carbon-containing material.

2. The method according to claim 1, wherein an oxygen partial pressure in an atmosphere for heat-treating the solid carbon is less than or equal to 0.133 Pa.

3. The method according to claim 1, wherein the step of processing the solid carbon-containing material further includes a sub-step of forming a metal layer on at least a part of the surface before the sub-step of forming non-diamond carbon.

4. The method according to claim 3, wherein the metal layer contains at least one metal element selected from the group consisting of iron, cobalt, nickel, rhodium, palladium, platinum, iridium, and manganese.

5. The method according to claim 3, wherein the metal layer contains at least one metal element selected from the group consisting of titanium, zirconium, hafnium, vanadium, niobium, tantalum, chromium, molybdenum, and tungsten.

6. The method according to claim 1, wherein a portion from which the non-diamond carbon is removed is a part of the surface.

7. The method according to claim 1, wherein a method for removing at least a part of the non-diamond carbon is at least one of a treating method using a gas phase fluid having a diameter smaller than a radius of an inscribed circle on the surface of the solid carbon-containing material, a treating method using an ion beam having a diameter smaller than a radius of an inscribed circle on the surface of the solid carbon-containing material, and a method for utilizing a mask having an opening having a circumscribed circle with a diameter smaller than a radius of an inscribed circle of the solid carbon-containing material.

8. A body obtained by processing a diamond-containing material, the body comprising a processed surface, at least a part of the processed surface being composed of diamond, wherein:

the processed surface of the body obtained by processing a diamond-containing material has a smooth shape having a maximum height of less than or equal to 20 µm of small irregularities formed in the processed surface, or a shape having irregularities formed in a smooth surface in the processed surface and having a minimum height of greater than or equal to 30 µm; and the processed surface has a size of greater than or equal to 1 mm square, and a density of polishing damage points in the processed surface is 0 points/mm$^2$.

9. The body according to claim 8, wherein a density of metal atoms in the processed surface is greater than or equal to 1 ppb.

10. The body according to claim 8, wherein the processed surface has a periodic small irregularities curved surface.

11. The body according to claim 8, wherein:

the processed surface includes a small recessed part bowing inward, and a small protrusion part bowing outward; and a total area of the small recessed part is greater than or equal to 60% of a total area of the processed surface when the processed surface is viewed from a direction perpendicular to a least-square plane thereof.

12. The body according to claim 8, wherein the diamond is at least one of single crystal diamond and polycrystalline diamond.

* * * * *